(12) United States Patent
Ren et al.

(10) Patent No.: US 11,658,237 B2
(45) Date of Patent: May 23, 2023

(54) TRENCH-GATE POWER MOSFET WITH OPTIMIZED LAYOUT

(71) Applicant: ZJU-Hangzhou Global Scientific and Technological Innovation Center, Zhejiang (CN)

(72) Inventors: Na Ren, Zhejiang (CN); Kuang Sheng, Zhejiang (CN); Zhengyun Zhu, Zhejiang (CN); Hu Chen, Zhejiang (CN)

(73) Assignee: ZJU-Hangzhou Global Scientific and Technological Innovation Center, Zhejiang (CN)

( * ) Notice: Subject to any disclaimer, the term of this patent is extended or adjusted under 35 U.S.C. 154(b) by 0 days.

(21) Appl. No.: 17/943,229

(22) Filed: Sep. 13, 2022

(65) Prior Publication Data

US 2023/0078222 A1  Mar. 16, 2023

(30) Foreign Application Priority Data

Sep. 15, 2021 (CN) .......................... 202111081863.2

(51) Int. Cl.
*H01L 29/78* (2006.01)
*H01L 29/06* (2006.01)
*H01L 29/423* (2006.01)

(52) U.S. Cl.
CPC ...... *H01L 29/7813* (2013.01); *H01L 29/0696* (2013.01); *H01L 29/4236* (2013.01)

(58) Field of Classification Search
CPC ............. H01L 29/7813; H01L 29/0696; H01L 29/4236
USPC ......................................................... 257/330
See application file for complete search history.

(56) References Cited

U.S. PATENT DOCUMENTS

2016/0141411 A1* 5/2016 Bobde ................. H01L 29/0634
257/334
2022/0052170 A1* 2/2022 Zeng ..................... H01L 29/407

FOREIGN PATENT DOCUMENTS

| CN | 108538910 A | 9/2018 |
|----|-------------|--------|
| CN | 112234095 A | 1/2021 |
| CN | 112599524 A | 4/2021 |
| CN | 113345965 A | 9/2021 |

\* cited by examiner

*Primary Examiner* — Igwe U Anya
(74) *Attorney, Agent, or Firm* — Gang Yu

(57) ABSTRACT

A trench-gate power MOSFET with optimized layout, comprising: a substrate; a first semiconductor region formed on the substrate, having a first doping type; mutually separated trench isolation gate structure, formed on the first semiconductor region, the trench isolation gate structure includes an gate oxide layer and a gate electrode; a second semiconductor region and a third semiconductor region formed between any two adjacent structures of mutually separated trench isolation gate structures; and a first shielding region, formed under each of the third semiconductor regions, connecting simultaneously with multiple mutually separated trench isolation structures.

19 Claims, 24 Drawing Sheets

TRENCH-GATE POWER MOSFET WITH OPTIMIZED LAYOUT

CROSS-REFERENCE TO RELATED APPLICATIONS

The present disclosure claims the priority of Chinese Patent Application No. 202111081863.2, filed to the China National Intellectual Property Administration on Sep. 15, 2021 and entitled "a trench-gate power MOSFET with optimized layout", which is incorporated herein its entirety by reference.

TECHNICAL FIELD

The present disclosure generally relates to semiconductor devices, and more particularly but not exclusively relates to a trench-gate power MOSFET (Metal-Oxide-Semiconductor Field Effect Transistor) with optimized layout.

BACKGROUND

Conventional silicon-based semiconductor power devices have gradually reached their material limit. Meanwhile, the third-generation semiconductor power devices (represented by SiC-based ones), featuring high working frequency, high working voltage, high working temperature and good radiation resistance, have revealed feasibility for higher power density and higher system efficiency.

As a representative SiC power switching device, SiC MOSFET features low switching loss, high working frequency, good drivability and suitability for paralleled use. Nowadays, SiC MOSFET has been gradually popularized and used in electric vehicles, charging piles, new energy power generation, industrial control, flexible DC power transmission and other applications. There are two kinds of SiC MOSFET categorized by the cell structure, planar-gate MOSFET and trench-gate MOSFET. Compared with planar-gate MOSFET, trench-gate MOSFET features higher channel mobility and narrower cell pitch, bringing the reduction of device resistance and the increase of current conduction density. However, when trench-gate MOSFET is in blocking state, the gate oxide layer at trench bottom is exposed to the high electric field in drift region easily. P-type electric field shielding region needs to be added to protect it.

FIG. 1 schematically shows a trench-gate MOSFET cell 000 structure with conventional layout. The conventional trench-gate MOSFET device contains a drain electrode 1, a source electrode 11 (to make the structure clearer, the source electrode 11 only draws a projection, represented by a closed area formed by dash line in the figure), a substrate 2, a first N-type SiC region 3, an oxide region 4, a gate region 5, a conventional P-type shielding region 10. The first N-type SiC region 3, is located on the substrate 2, which has a first N-type doping concentration. A second N-type SiC region 6, a first P-type SiC region 7, a second P-type SiC region 8 are located on the first N-type SiC region 3, the second N-type SiC region 6 has a second N-type doping concentration, the first P-type SiC region 7 has a first P-type doping concentration, the second P-type SiC region 8 has a second P-type doping concentration. The oxide region 4 is located on the first N-type SiC region 3; The gate region 5 is located on the oxide region 4; The conventional P-type shielding region 10 is located under the first P-type SiC region 7, which has a third P-type doping concentration; The source electrode 11 and the second N-type SiC region 6 as well as the first P-type SiC region 7, the drain electrode 1 and the substrate 2 are all formed Ohmic contact. Direction x, direction y and direction z are perpendicular to each other in the figure.

In the conventional trench-gate MOSFET cell 000 as shown in FIG. 1, conventional P-type shielding region 10 is isolated from each other, which may lead to different potential in each conventional P-type shielding region 10, influencing device reliability. Meanwhile, the active area utilization rate of this layout is not high. In order to further improve the current conduction capability and reliability, the cell layout of the device needs to be optimized.

SUMMARY

It is an object of the present disclosure to provide a trench-gate power MOSFET with optimized layout.

An embodiment of the present disclosure is directed to a trench-gate power MOSFET with optimized layout, including: a substrate; the first semiconductor region formed on the substrate, which has the first doping type; mutually separated trench isolation gate structure formed on the first semiconductor region, each of the trench isolation gate structure includes a gate oxide layer and a gate electrode; a second semiconductor region and a semiconductor region formed between any two adjacent structures of mutually separated trench isolation gate structure, the second semiconductor region has a first doping type, the third semiconductor region has a second doping type; and a first shielding region, is formed under the third semiconductor region, which connects multiple mutually separated trench isolation gate structures.

Another embodiment of the present disclosure is directed to a trench-gate power MOSFET with an optimized layout, including: a substrate and a first semiconductor region with a first doping type formed on the substrate; mutually separated trench isolation gate structures formed on the first semiconductor region; and at least one first shielding region with a second doping type, which connects multiple mutually separated trench isolation gate structures simultaneously, a shape of the at least one first shielding region and a position of the at least one first shielding region are defined by adjacent vertices of multiple trench isolation gate structures connecting to the at least one first shielding region, wherein the first shielding region is formed below the third semiconductor region and adjacent to the third semiconductor region.

BRIEF DESCRIPTION OF THE DRAWINGS

The present disclosure can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION OF THE EMBODIMENTS

Figure 1:
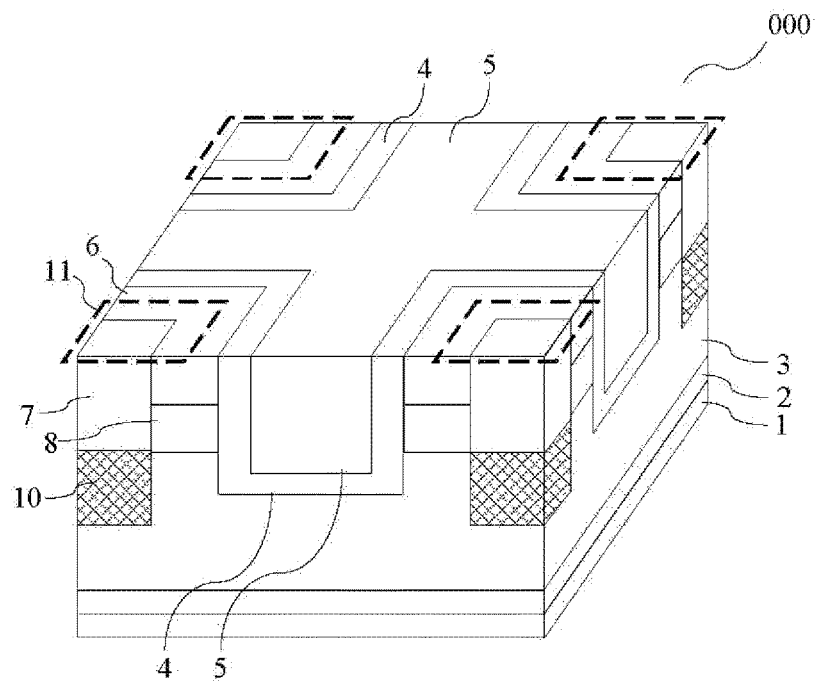
FIG. 1 schematically shows a cell 000 of a trench-gate power MOSFET with conventional layout.

Reference will now be made in detail to the preferred embodiments of the disclosure, examples of which are illustrated in the accompanying drawings. While the disclosure will be described in conjunction with the preferred embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be obvious to one of ordinary skill in the art that the present disclosure may be practiced without these specific details. In other instances, well-known methods, procedures, components, and circuits have not been described in detail so as not to unnecessarily obscure aspects of the present disclosure. Throughout the specification, references to "one embodiment," "an embodiment," "an example," or "example" indicates that a specific feature, structure, or characteristic described in the embodiment or example is included in the present disclosure In at least one embodiment. Therefore, the phrases "in one embodiment," "in an embodiment," "an example," or "example" appearing in various parts throughout the specification do not necessarily all refer to the same embodiment or example. In addition, specific features, structures, or characteristics may be combined in one or more embodiments or examples in any suitable combination and/or sub-combination. Those of ordinary skill in the art should understand that the drawings provided herein are for illustrative purposes, and the same reference numerals indicate the same elements, but are not limited to that the structure of the elements must be exactly the same. The term "and/or" as used herein includes any and all combinations of one or more of the associated listed items. The material of semiconductor regions in the trench-gate power MOSFET of the present disclosure includes, but is not limited to, Silicon Carbide, Gallium Nitride and silicon. Throughout the specification, the semiconductor regions in the present disclosure can be Silicon Carbide regions, silicon regions or any other semiconductor material regions applicable to the present disclosure. Although the embodiments of the present disclosure indicate that the doping type of each region is N-type or P-type. However, those who are skilled in the art should know that in other embodiments, the doping type of each region is not limited to the N-type or P-type specified in the present disclosure. For example, N-type and P-type doping can be interchanged. The alternate arrangement can be a complete alternate arrangement or an alternate arrangement including a device structure in the middle. For example, the two units also include other structures, or the two units also include the same structure as a certain unit. The paralleled units referred to in the present disclosure can mean that the two units are paralleled with a distance or the two units are overlapped. The top-view plane referred to in the present disclosure is not limited to the top-view plane on the surface of the semiconductor region, and may also be a certain cross-sectional view from the top of the device.

Figure 2:
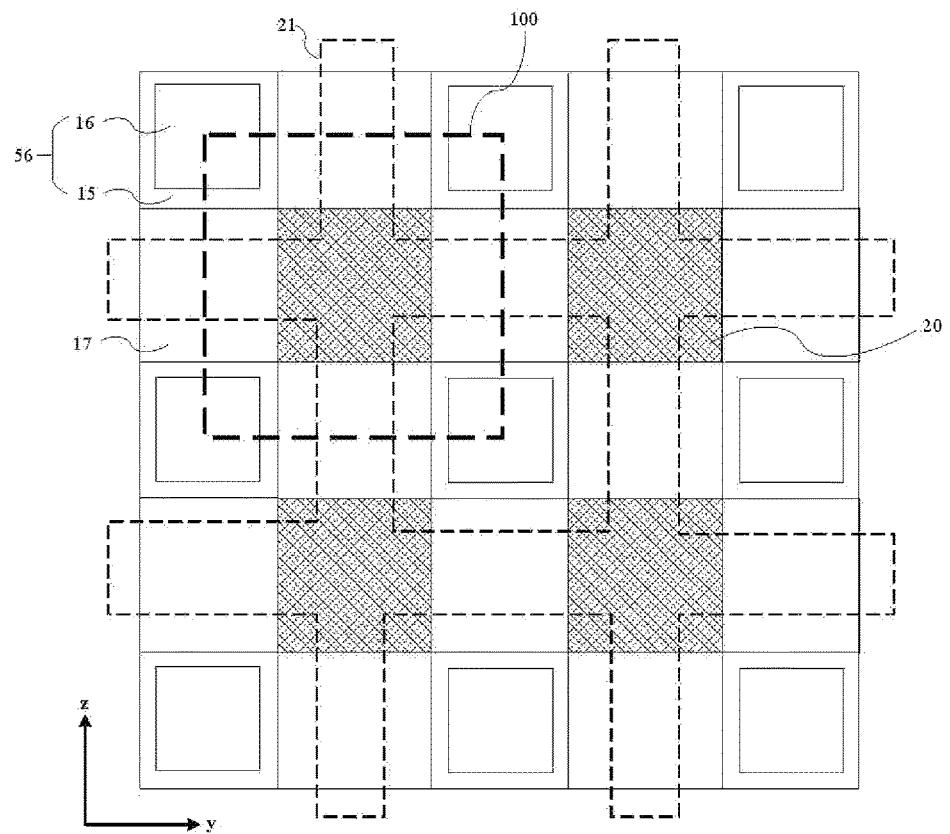
FIG. 2 shows a top view of a quadrilateral trench-gate power MOSFET with optimized layout with an embodiment of the present disclosure.
Figure 3:
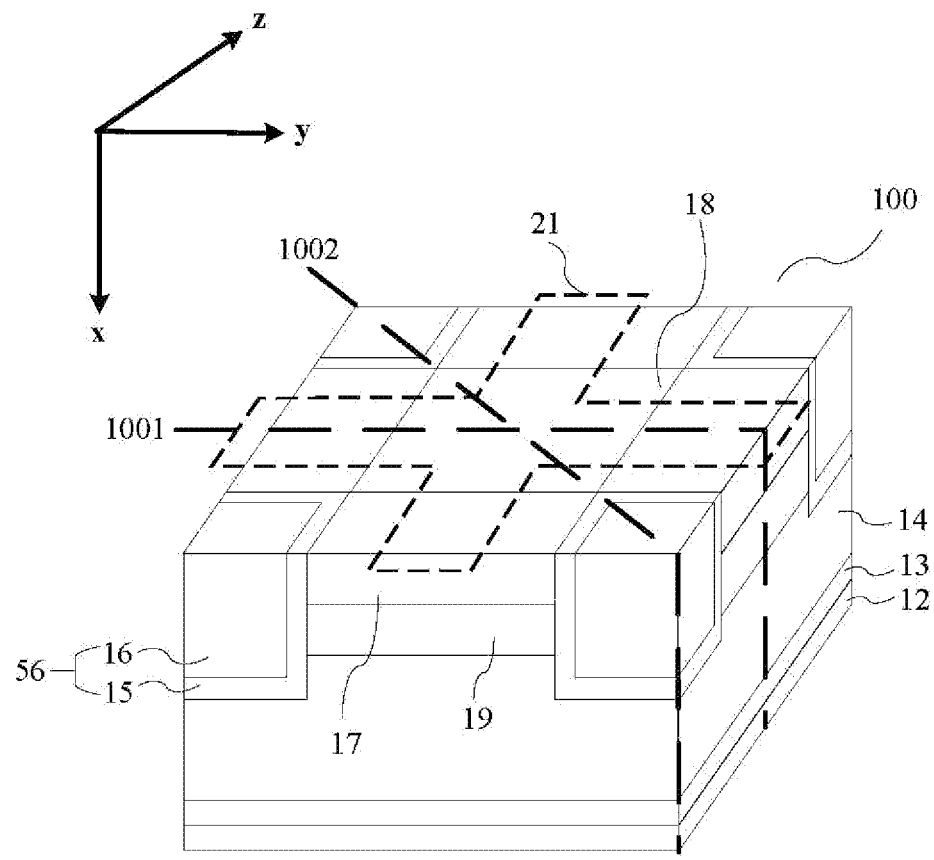
FIG. 3 schematically shows the cell 000 of the quadrilateral trench-gate power MOSFET in FIG. 2 with an embodiment of the present disclosure.
Figure 4:
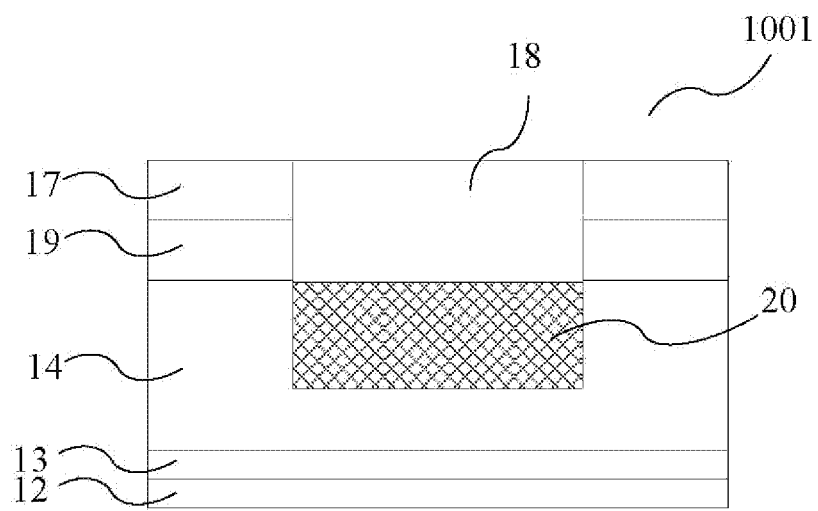
FIG. 4 shows a cross-section view of the cell 000 of the quadrilateral trench-gate power MOSFET in region 1001 with an embodiment of the present disclosure.
Figure 5:
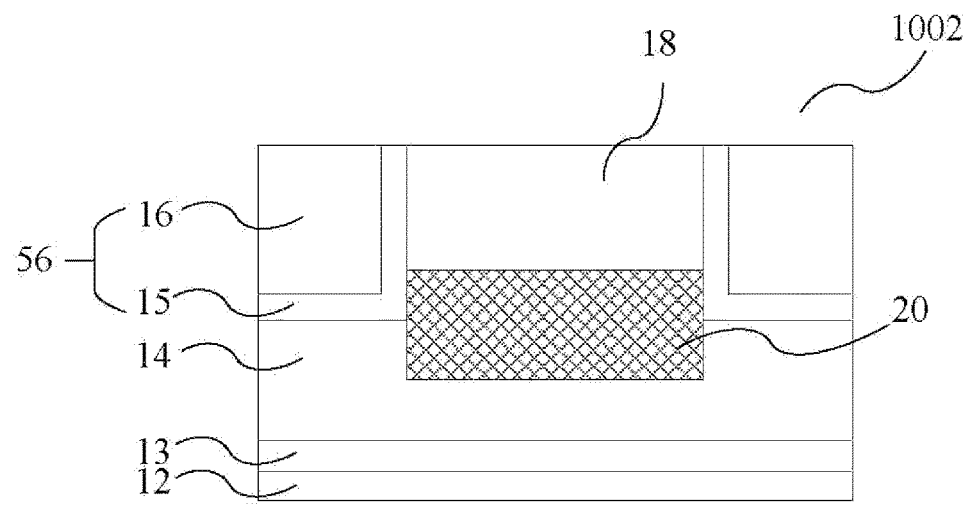
FIG. 5 shows a cross-section view of the cell 000 of the quadrilateral trench-gate power MOSFET in region 1002 with an embodiment of the present disclosure.

FIG. 2 shows a top view of a quadrilateral trench-gate power MOSFET with optimized layout with an embodiment of the present disclosure (to reflect the distribution of the first shielding region 20 in the top view, the projection is also shown in it). FIG. 3 schematically shows a cell 001 of the quadrilateral trench-gate power MOSFET structure in FIG. 2. FIG. 4 and FIG. 5 are the cross-section views of the cell 001 of the quadrilateral trench-gate power MOSFET in region 1001 and 1002, respectively. With embodiments shown in FIG. 2 to FIG. 5, the cell 001 of the quadrilateral trench-gate power MOSFET includes a drain region 12, a source region 21 (to make the structure clearer, the source region 21 is projected only and represented by a closed region formed by dash line in the figure), a substrate 13, a first semiconductor region 14, a trench isolation gate structure 56, a second semiconductor region 17, a third semiconductor region 18, a fourth semiconductor region 19, a first shielding region 20. The first semiconductor region 14 formed on the substrate 13, has a first N-type doping concentration (e.g., $1 \times 10^{16}$ cm$^{-3}$); a second semiconductor region 17, a third semiconductor region 18, a fourth semiconductor region 19, is formed between multiple trench isolation gate structures 56; the second semiconductor region 17 has a second N-type doping concentration (e.g., $1 \times 10^{19}$ cm$^{-3}$); The third semiconductor region 18 has a first P-type doping concentration (e.g., $1 \times 10^{19}$ cm$^{-3}$). The fourth semiconductor region 19 has a second P-type doping concentration ($2 \times 10^{17}$ cm$^{-3}$); the trench isolation gate structure 56 consists of an gate oxide layer 15 and a gate electrode 16, the gate oxide layer 15 is formed on the first semiconductor region 14, the both sides of the second semiconductor region 17 and the fourth semiconductor region 19; The gate electrode 16 is wrapped by an gate oxide layer 15; The first shielding region 20, connecting to multiple mutually separated trench isolation gate structures 56 simultaneously, is formed under the third semiconductor region 18, the shape and position are defined by the adjacent vertices of multiple gate oxide layers 15 connecting to it. (e.g., defined by the shortest straight line between adjacent vertices), having a third P-type doping concentration, the third P-type doping concentration could be equal to the first P-type doping concentration, could also be slightly higher or slightly lower than the first P-type doping, concentration. The third P-type doping concentration could be a box distribution, could also employ a distribution with deep decay. The source region 21, the second semiconductor region 17 and the third semiconductor region 18, the drain region 12 and the substrate 13 are all formed Ohmic contact. With an embodiment of the present disclosure, the cross-section shape of the first shielding region 20 is similar to that of the third semiconductor region 18, which is a quadrilateral formed by the four vertices of the four adjacent gate oxide layers 15. With other embodiments, the cross-section structure of the quadrilateral trench-gate power MOSFET in region 1001 is not limited to the structure shown in FIG. 4. The cross-section structure of the quadrilateral trench-gate power MOSFET in region 1002 is not limited to the structure shown in FIG. 5. Those skilled in the art may add appropriate regions and structures shown in the accompanying drawings of the present disclosure specification according to practical needs.

Figure 6:
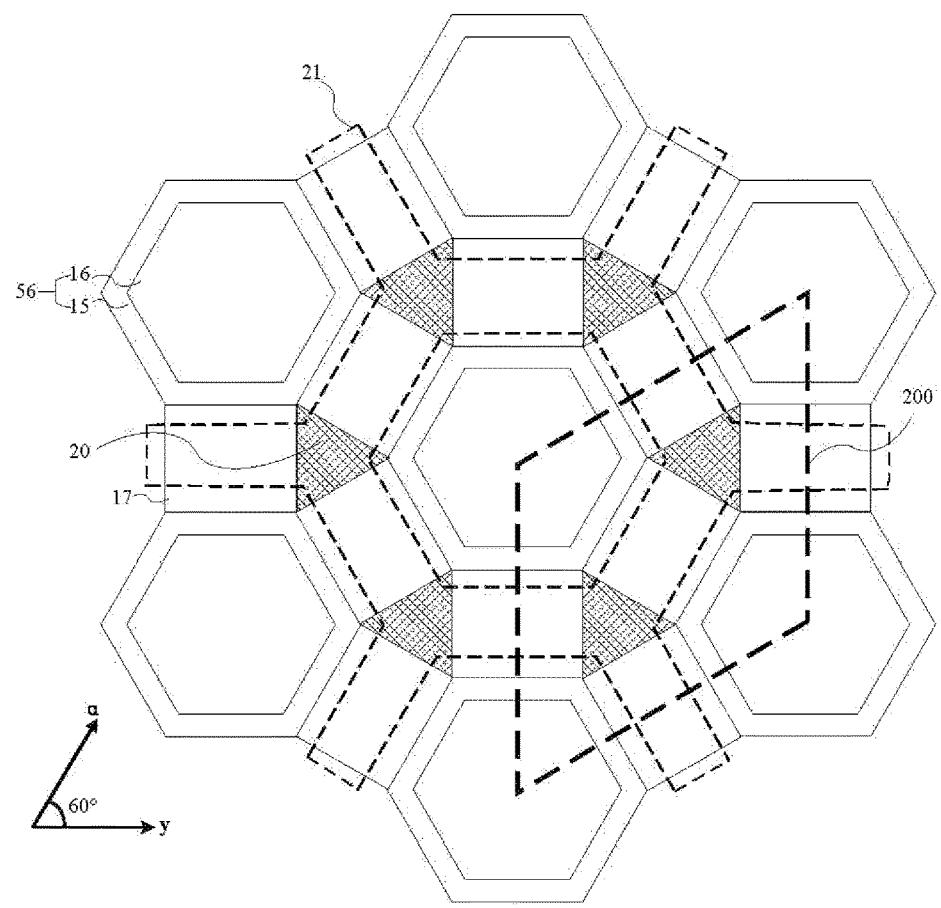
FIG. 6 shows a top view of a hexagonal trench-gate power MOSFET with optimized layout with an embodiment of the present disclosure.
Figure 7:
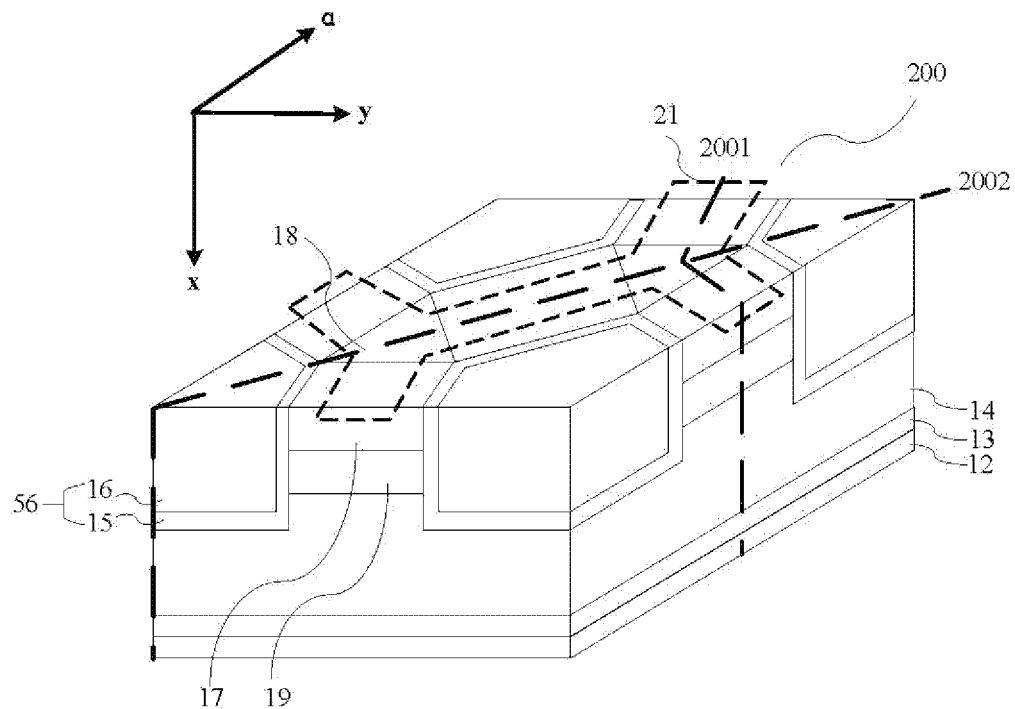
FIG. 7 schematically shows a cell 200 of the hexagonal trench-gate power MOSFET in FIG. 6 with optimized layout with an embodiment of the present disclosure.
Figure 8:
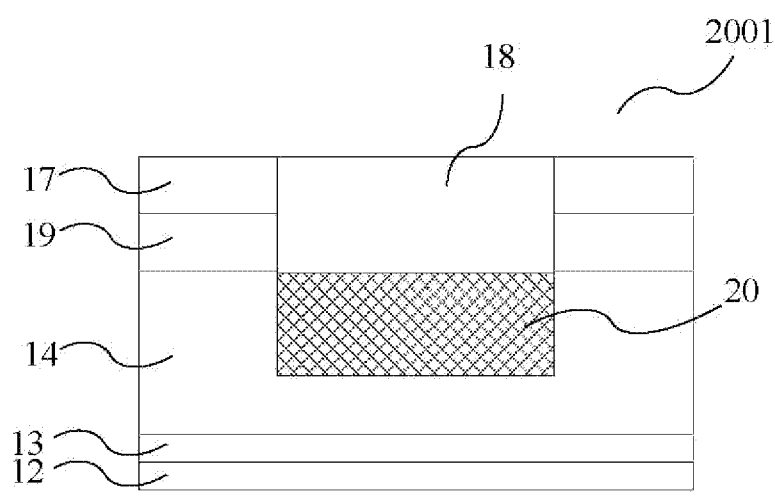
FIG. 8 shows a cross-section view of the cell 200 of the hexagonal trench-gate power MOSFET in region 2001 in FIG. 6 with an embodiment of the present disclosure.
Figure 9:
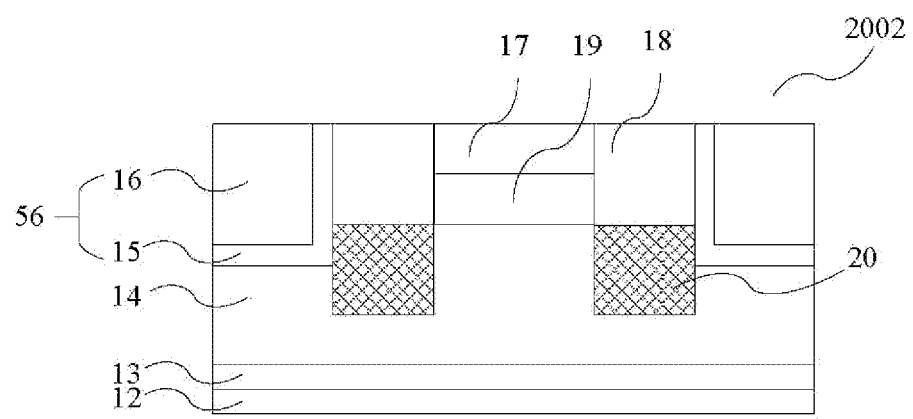
FIG. 9 shows a cross-section view of the cell 200 of the hexagonal trench-gate power MOSFET in region 2002 in FIG. 6 with an embodiment of the present disclosure.

FIG. 6 shows a top view of a hexagonal trench-gate power MOSFET with optimized layout with an embodiment of the present disclosure (to reflect the distribution of the first shielding region 20, the projection is also shown in the top view). FIG. 7 schematically shows a cell 200 of the hexagonal trench-gate power MOSFET in FIG. 6. FIG. 8 and FIG. 9 are cross-section views of the cell 200 of the hexagonal trench-gate power MOSFET in region 2001 and 2002, respectively. The angle between the direction a and the direction y is 60 degrees, and the hexagon can be a regular hexagon. The difference between the cell 200 of the hexagonal trench-gate power MOSFET and the cell 200 of the quadrilateral trench-gate power MOSFET with embodiments shown in FIG. 2 to FIG. 5 is that trench isolation gate structure 56 is a hexagonal layout, the first shielding region 20 connects multiple mutually separated trench isolation gate structures 56, the shape and position are defined by the adjacent vertices of multiple gate oxide layers 15 connecting to it. (e.g., defined by the shortest straight line between adjacent vertices), the cross-section shape is similar to that of the third semiconductor region 18, which is a triangle formed by the connection of three vertices of three gate oxide layers 15 adjacent to it. In an embodiment shown in FIG. 9, the first shielding region 20 is located under the third semiconductor region 18, and on the both sides of the second semiconductor region 17 and the fourth semiconductor region 19.

The advantage of the embodiment shown in FIG. 2 to FIG. 9 compared to the conventional cell design in FIG. 1 is by transforming the position of the third semiconductor region 18, the first shielding region 20 and the trench isolation gate structure 56 (e.g., interchange position), and setting the position of the third semiconductor region 18 and the first shielding region 20 between the vertices of adjacent trench isolation gate structure 56, can greatly reduce device cell pitch and improve device current conduction capability, while maintaining the gate oxide layer reliability.

Figure 10:
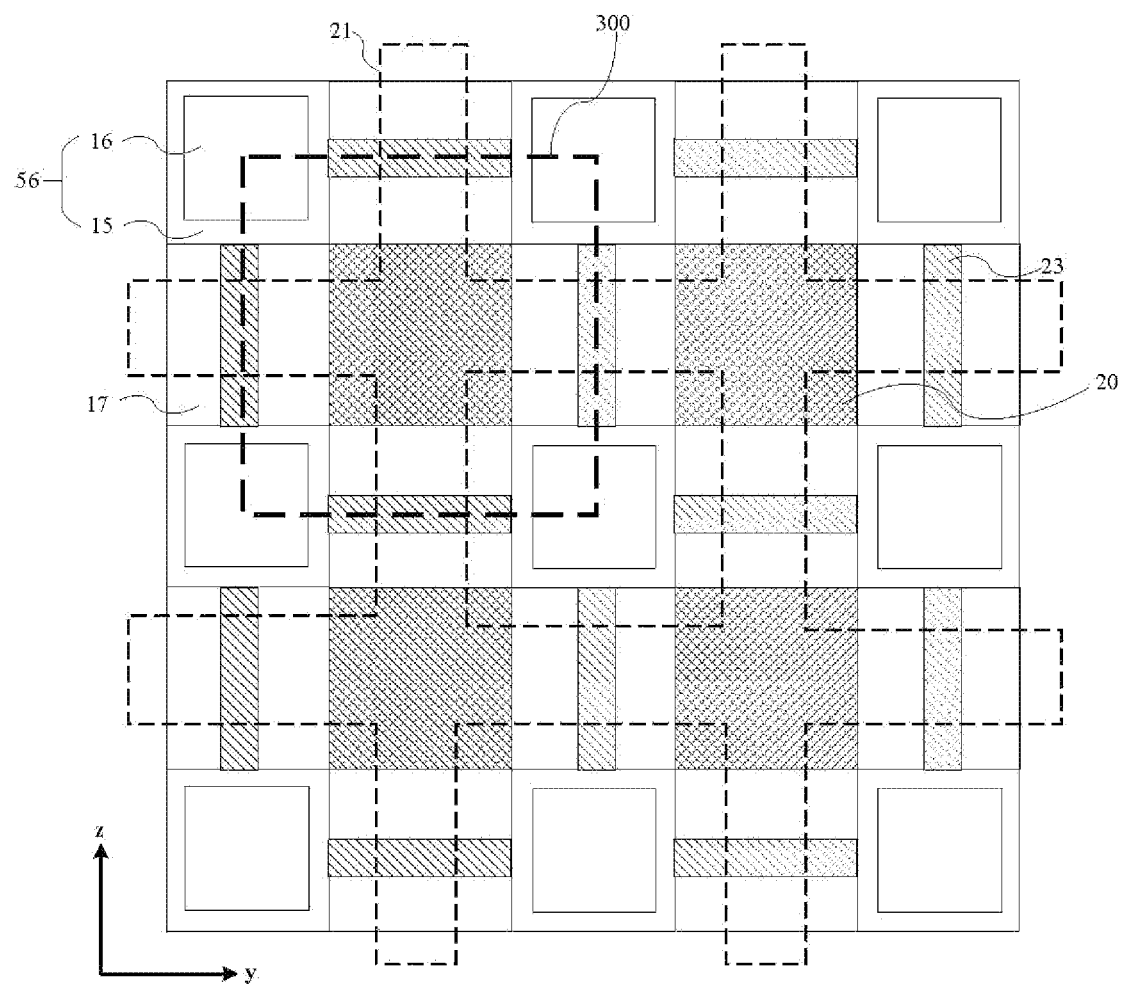
FIG. 10 shows a top view of a quadrilateral trench-gate power MOSFET with optimized layout with another embodiment of the present disclosure.
Figure 11:
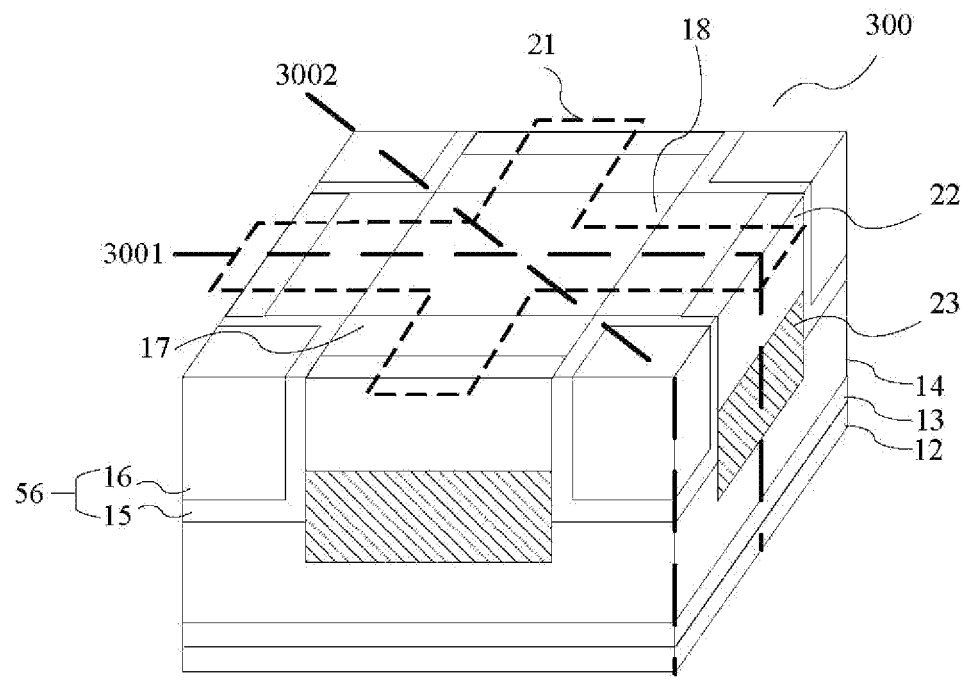
FIG. 11 schematically shows a cell 300 of the quadrilateral trench-gate power MOSFET in FIG. 10 with an embodiment of the present disclosure.
Figure 12:
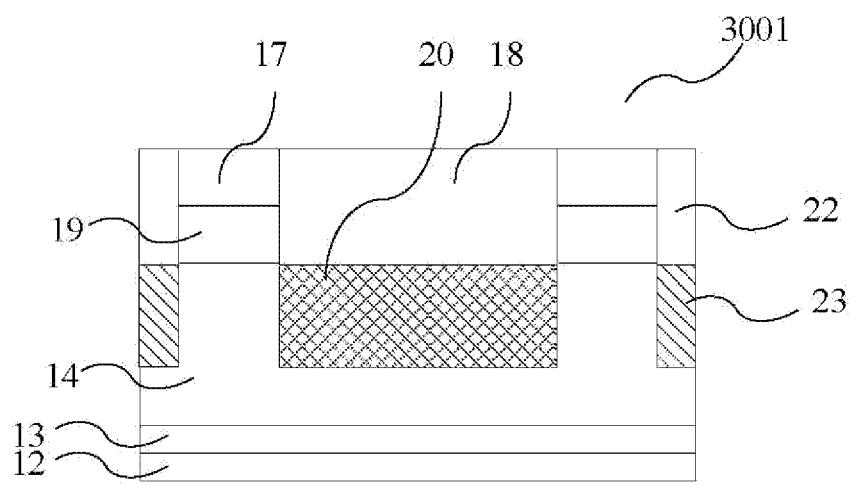
FIG. 12 shows a cross-section view of the cell 300 of the quadrilateral trench-gate power MOSFET in region 3001 in FIG. 10 with an embodiment of the present disclosure.
Figure 13:
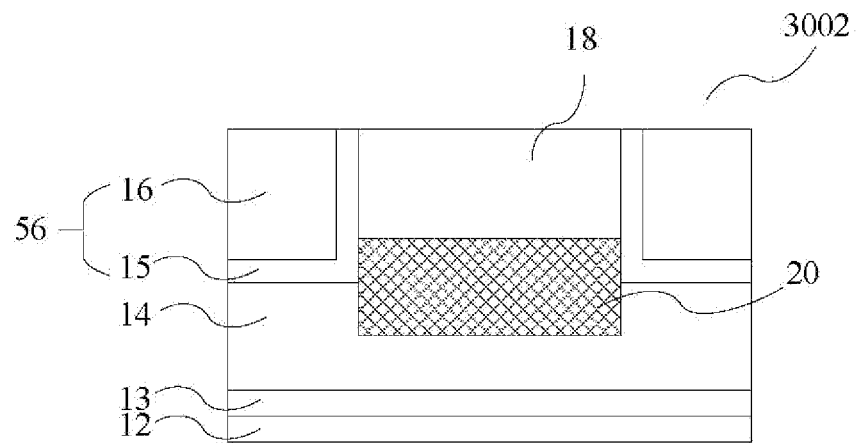
FIG. 13 shows a cross-section view of the cell 300 of the quadrilateral trench-gate power MOSFET in region 3002 in FIG. 10 with an embodiment of the present disclosure.

FIG. 10 shows a top view of a quadrilateral trench-gate power MOSFET with optimized layout with another embodiment of the present disclosure (to reflect the distribution in the top view of the first shielding region 20, a second shielding region 23, the projection is also shown in it). FIG. 11 schematically shows a cell 300 of the quadrilateral trench-gate power MOSFET in FIG. 10. FIG. 12 and FIG. 13 are the cross-sectional views of the cell 300 of the quadrilateral trench-gate power MOSFET in region 3001 and 3002, respectively. With the embodiments as shown in FIG. 10 to FIG. 13, the difference between the cell 300 of the quadrilateral trench-gate power MOSFET and the cell 200 of the quadrilateral trench-gate power MOSFET in the embodiment shown in FIG. 2 to FIG. 5 is that, the cell 300 further including the second shielding region 23 formed under the fifth semiconductor region 22, wherein the fifth semiconductor region 22 has the first P-type doping concentration (e.g., $1 \times 10^{19}$ cm$^{-3}$), the second shielding region 23 intersects simultaneously with two or more than two trench isolation gate structures 56 at the sidewall of trench isolation gate structure 56 (e.g., simultaneously intersects with adjacent or opposite edges of two adjacent gate oxide layers 15), and does not intersect with the first shielding region 20, the shape can be defined by adjacent edges of two or more gate oxide layers 15, which has the third P-type doping concentration. With an embodiment of the present disclosure, the cross-section shape of the second shielding region 23 is similar to that of the fifth semiconductor region 22, which is a square or rectangle between two edges of two gate oxide layers 15 adjacent to it, connecting to two adjacent trench isolation gate structures 56. With the embodiment in FIG. 12, the first shielding region 20 and the second shielding region 23 are distributed in both sides of the second semiconductor region 17 and the fourth semiconductor region 19.

Figure 14:
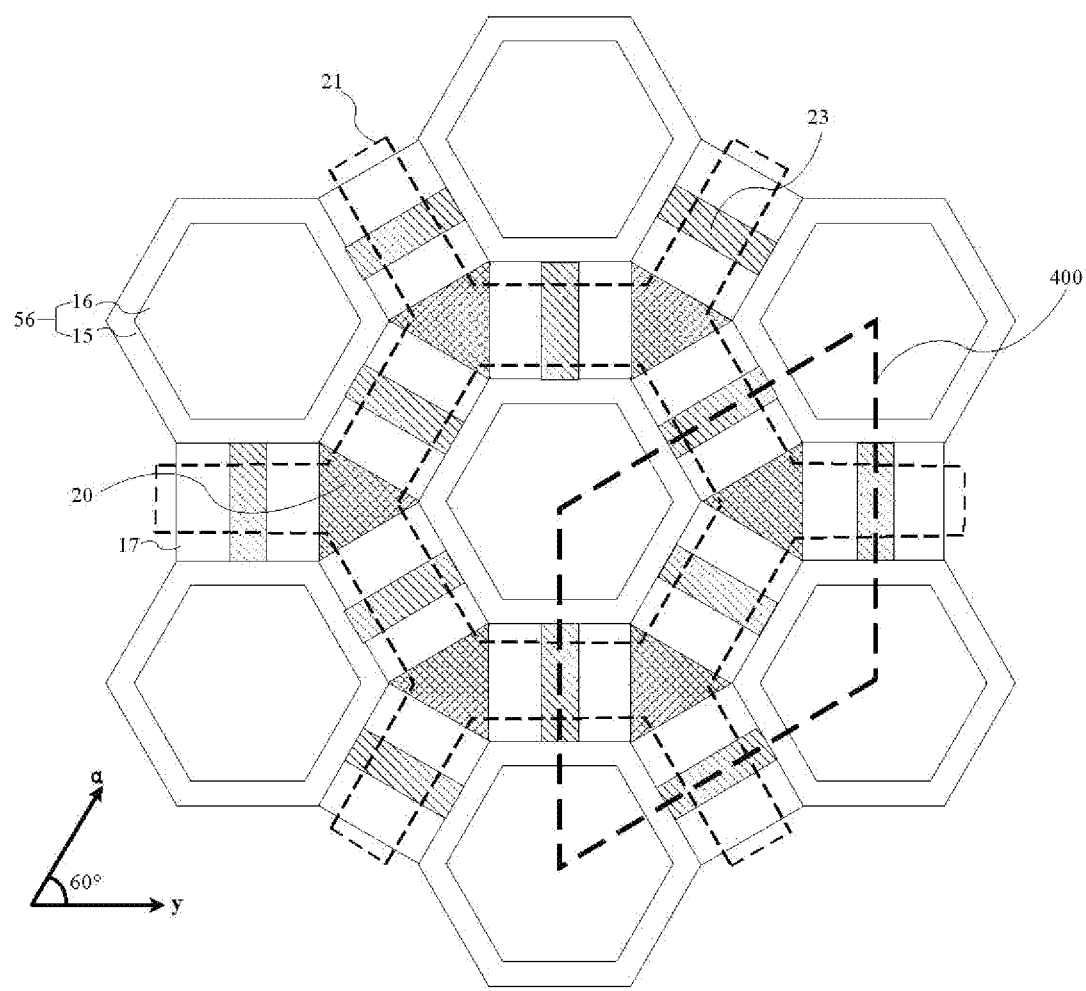
FIG. 14 shows a top view of a hexagonal trench-gate power MOSFET with optimized layout with another embodiment of the present disclosure.
Figure 15:
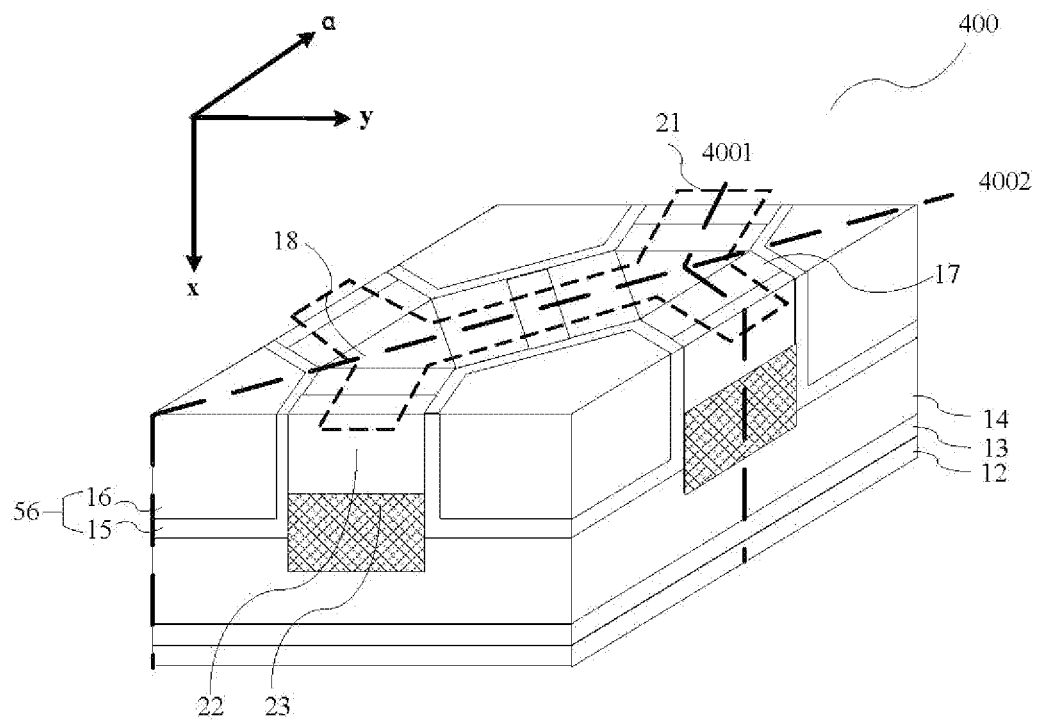
FIG. 15 schematically shows a top view of a cell 400 of the hexagonal trench-gate power MOSFET in FIG. 14 structure with an embodiment of the present disclosure.
Figure 16:
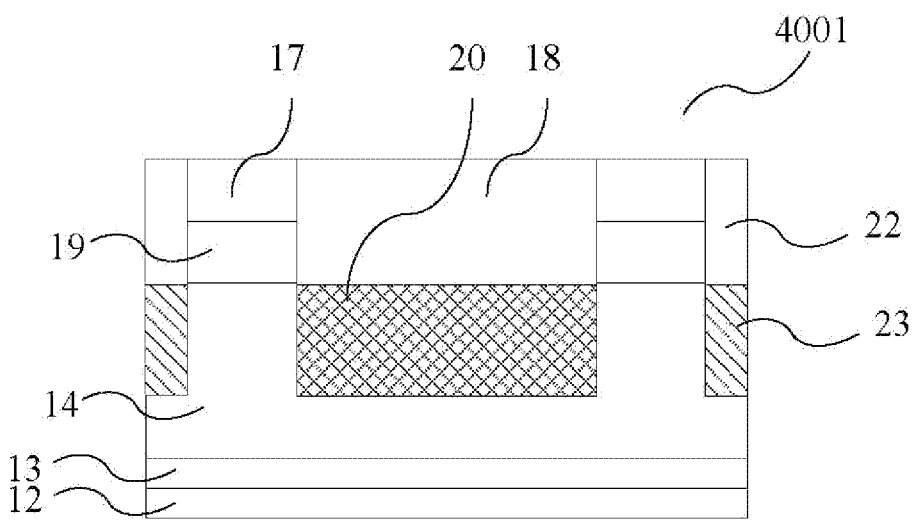
FIG. 16 shows a cross-section view of the cell 400 of the hexagonal trench-gate power MOSFET in region 4001 in FIG. 14 with an embodiment of the present disclosure.
Figure 17:
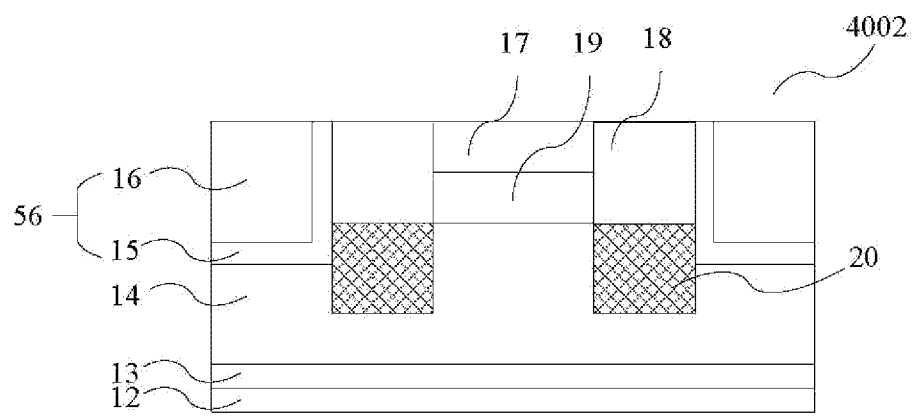
FIG. 17 shows a cross-section view of the cell 400 of the hexagonal trench-gate power MOSFET in region 4002 in FIG. 14 with an embodiment of the present disclosure.

FIG. 14 shows a top view of a hexagonal trench-gate power MOSFET with optimized layout with another embodiment of the present disclosure (to reflect the distribution in the top view of the first shielding region 20, the second shielding region 23, the projection is also shown in it). FIG. 15 schematically shows the cell 400 in FIG. 14. FIG. 16 and FIG. 17 are the cross-section views of the cell 400 of the hexagonal trench-gate power MOSFET in region 4001 and 4002, respectively. With embodiments shown in FIG. 14 to FIG. 17, the difference between the cell 400 of the hexagonal trench-gate power MOSFET and the cell 200 of the hexagonal trench-gate power MOSFET with embodiments shown in FIG. 5 to FIG. 9 is that, the cell 400 further including the second shielding region 23 formed under the fifth semiconductor region 22, the second shielding region 23 is distributed between two adjacent trench isolation gate structures 56, intersects simultaneously with two or more than two trench isolation gate structures 56 at the sidewall of trench isolation gate structure 56 (e.g., simultaneously intersects with adjacent or opposite edges of two adjacent gate oxide layers 15), and does not intersect with the first shielding region 20, the shape can be defined by adjacent edges of two or more gate oxide layers 15 connecting to it, which could have the third P-type doping concentration.

With an embodiment of the present disclosure, the second shielding region 23 are formed between every two adjacent trench isolation gate structures 56, the cross-section shape of the second shielding region 23 is similar to that of the fifth semiconductor region 22, which is a square or rectangle between two edges of two gate oxide layers 15 adjacent to it, connecting to two adjacent trench isolation gate structures 56. With the embodiment in FIG. 16, the first shielding region 20 and the second shielding region 23 are distributed in both sides of the second semiconductor region 17 and the fourth semiconductor region 19. With an embodiment shown in FIG. 17, the first shielding region 20 is located under the third semiconductor region 18, and on both sides of the second semiconductor region 17 and the fourth semiconductor region 19.

The embodiments shown in FIG. 10 to FIG. 17 compared with that in FIG. 2 to FIG. 9, further increase the total area of the shielding region, improve the gate oxide layer reliability, the increased shielding region does not need additional fabrication steps and overlay margin, maintaining the device area utilization rate.

Figure 18:
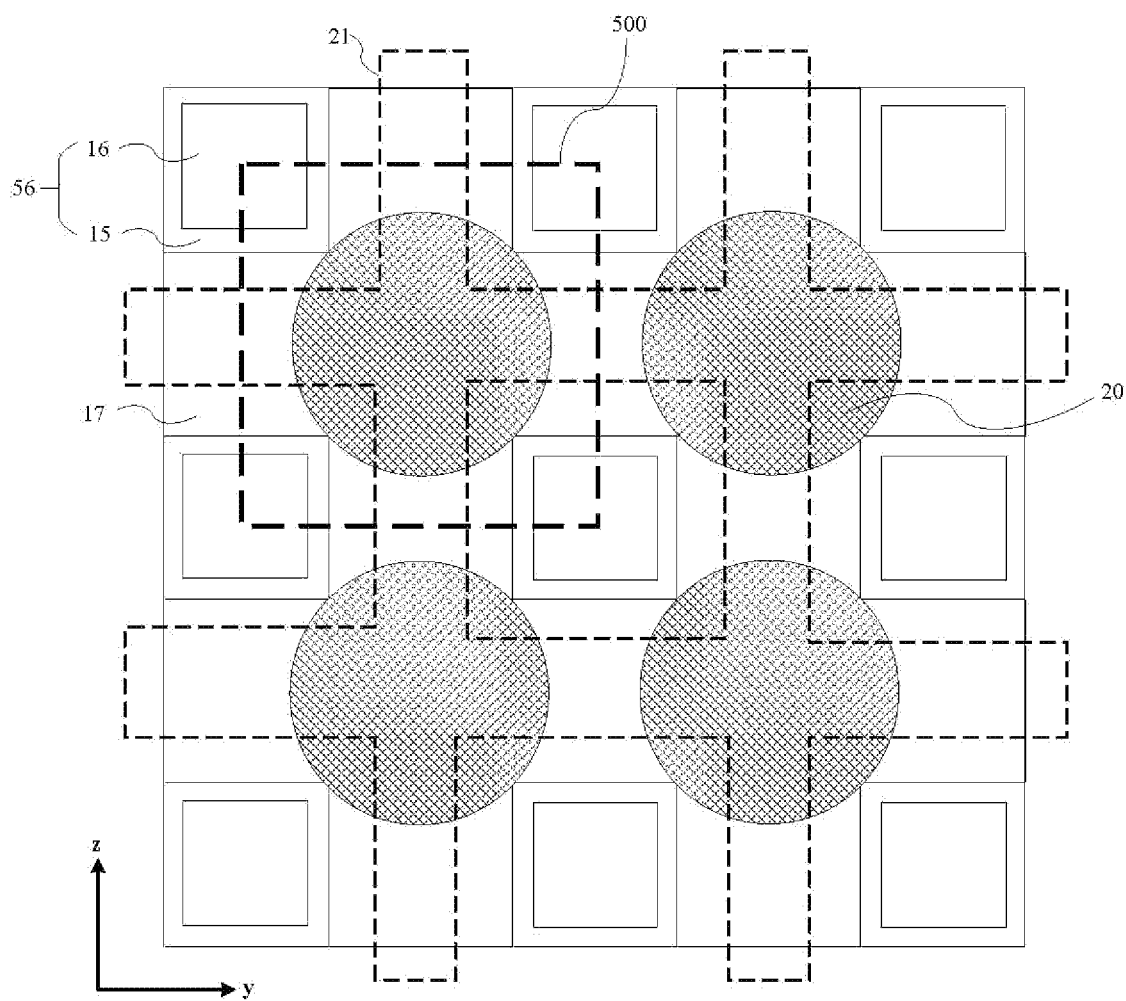
FIG. 18 shows a top view of a quadrilateral trench-gate power MOSFET with optimized layout with another embodiment of the present disclosure.
Figure 19:
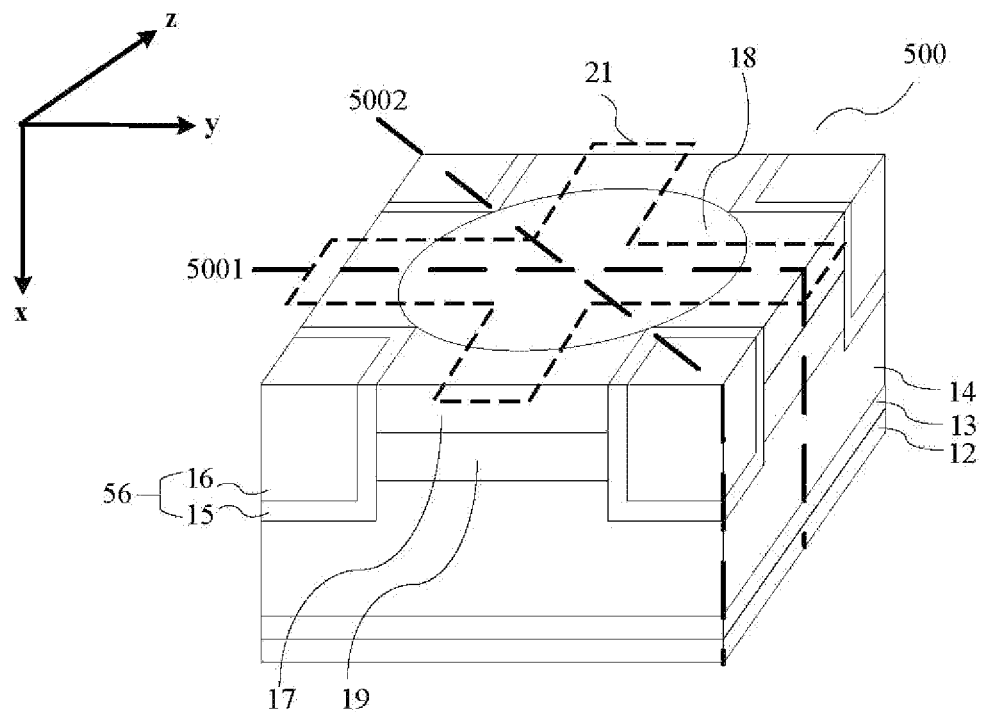
FIG. 19 schematically shows a cell 500 of the quadrilateral trench-gate power MOSFET in FIG. 18 with an embodiment of the present disclosure.
Figure 20:
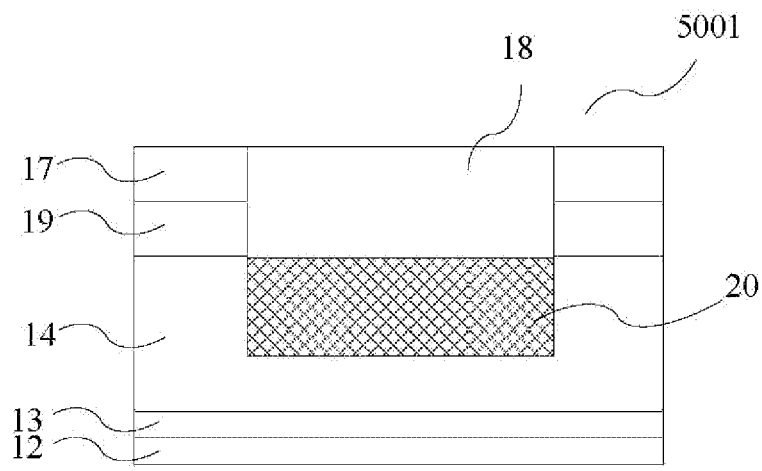
FIG. 20 shows a cross-section view of the cell 500 of the quadrilateral trench-gate power MOSFET in region 5001 in FIG. 18 with an embodiment of the present disclosure.
Figure 21:
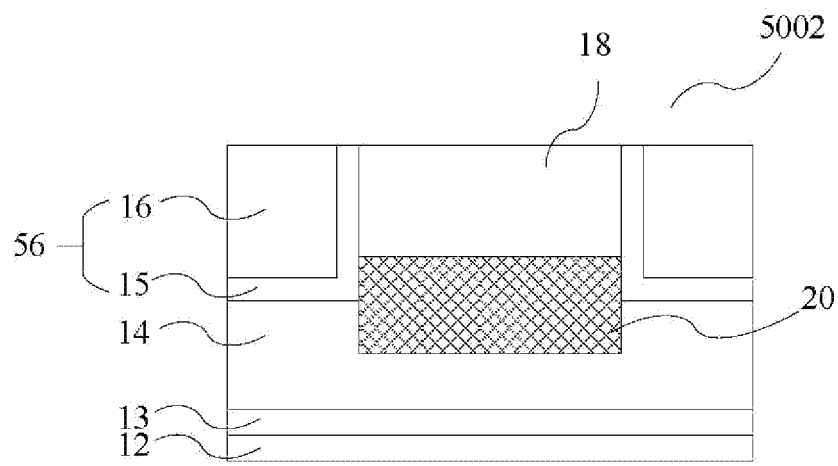
FIG. 21 shows a cross-section view of the cell 500 of the quadrilateral trench-gate power MOSFET in region 5002 in FIG. 18 with an embodiment of the present disclosure.
Figure 22:
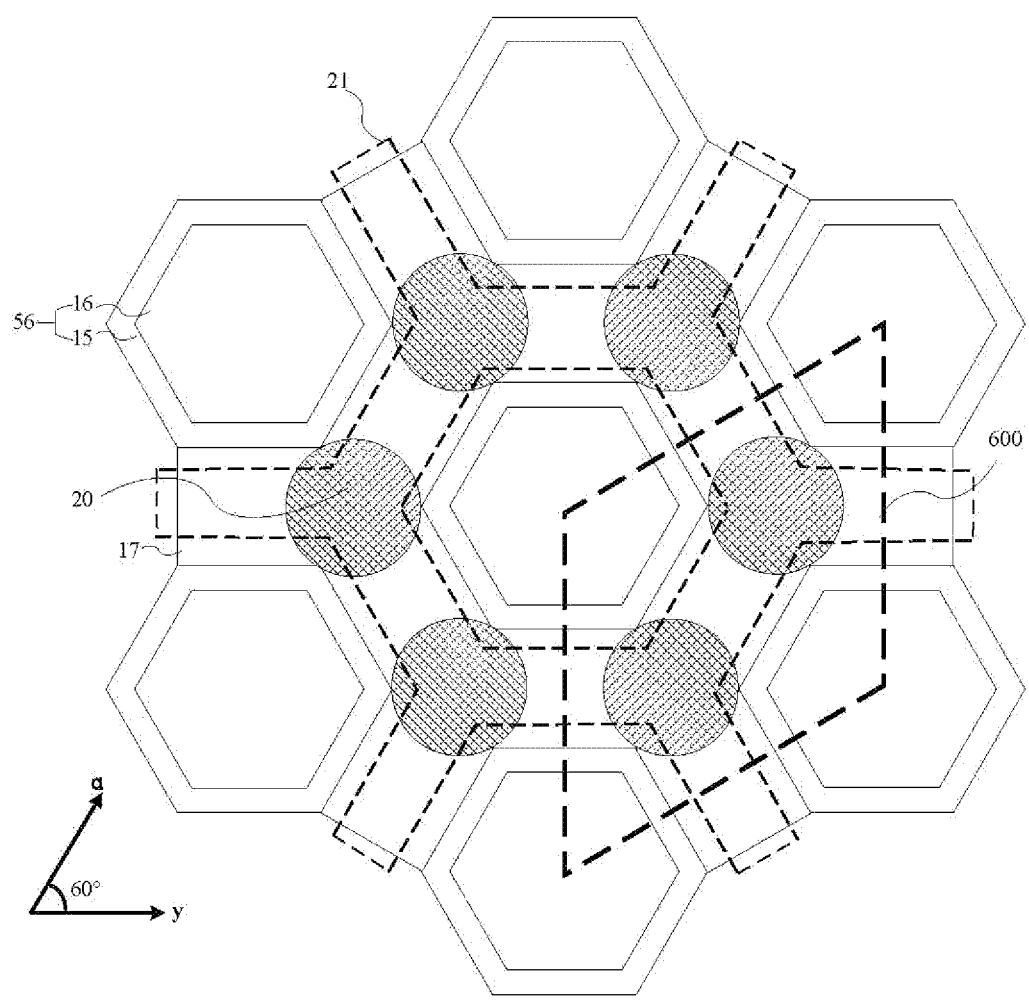
FIG. 22 shows a top view of a hexagonal trench-gate power MOSFET with optimized layout with another embodiment of the present disclosure.
Figure 23:
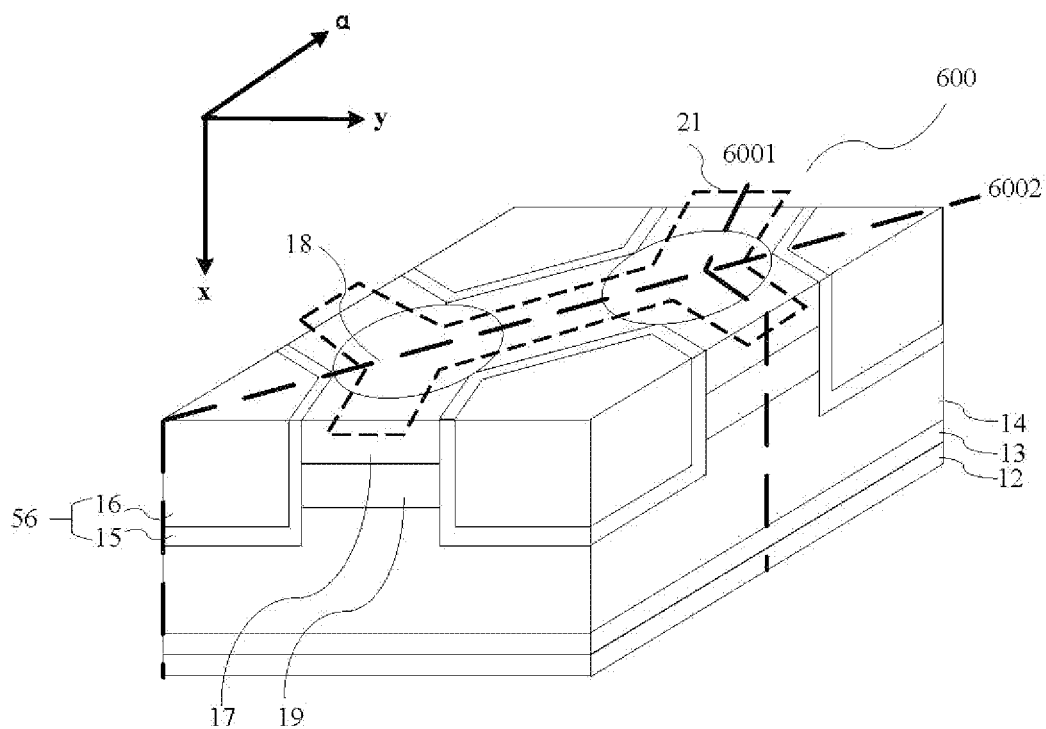
FIG. 23 schematically shows a cell 600 of the hexagonal trench-gate power MOSFET in FIG. 22 with an embodiment of the present disclosure.
Figure 24:
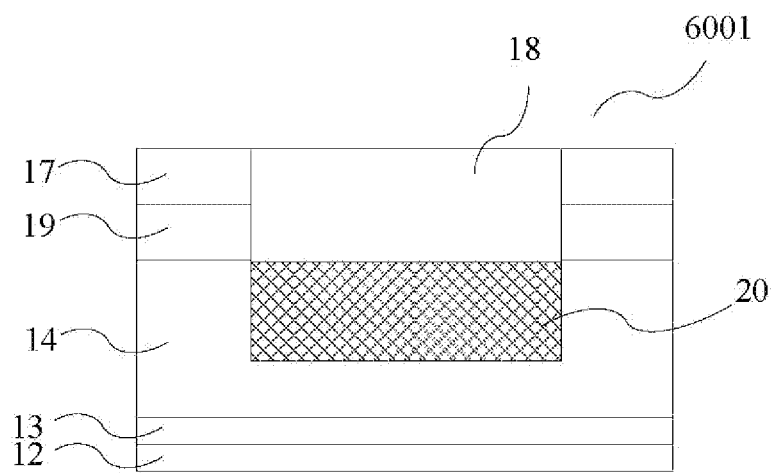
FIG. 24 shows a cross-section view of the cell 600 of the hexagonal trench-gate power MOSFET in region 6001 in FIG. 22 with an embodiment of the present disclosure.
Figure 25:
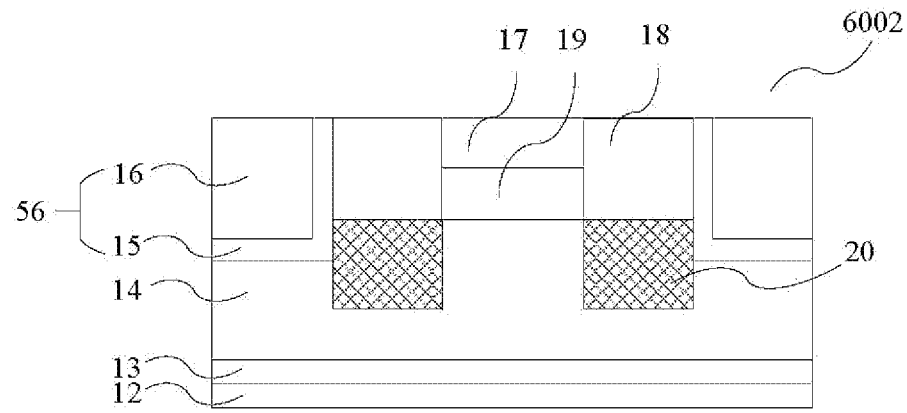
FIG. 25 shows a cross-section view of the cell 600 of the hexagonal trench-gate power MOSFET in region 6002 in FIG. 22 with an embodiment of the present disclosure.

FIG. 18 shows a top view of a quadrilateral trench-gate power MOSFET with optimized layout with another embodiment of the present disclosure (to reflect the distribution in the top view of the first shielding region 20, the projection is also shown in it). FIG. 19 schematically shows a cell 500 of the quadrilateral trench-gate power MOSFET in FIG. 18. FIG. 20 and FIG. 21 are the cross-section views of the cell 500 of the quadrilateral trench-gate power MOSFET in region 5001 and 5002. With embodiments shown in FIG. 18 to FIG. 21, the difference between the cell 500 of the quadrilateral trench-gate power MOSFET and the cell 200 of the quadrilateral trench-gate power MOSFET with embodiments shown in FIG. 2 to FIG. 5 is that, the cross-section shape of the first shielding region 20 connecting simultaneously to multiple mutually separated trench isolation gate structures 56 is similar to that of the third semiconductor region 18, which is the smallest circle determined by four vertices of four gate oxide layers 15 adjacent to it.

The embodiments shown in FIG. 18 to FIG. 25 compared with that in FIG. 2 to FIG. 9, further increase the total area of the shielding region, and emphatically strengthen the shielding of trench corner, which is good for reducing the electric field in the gate oxide layer corner, further improving the oxide reliability.

Figure 26:
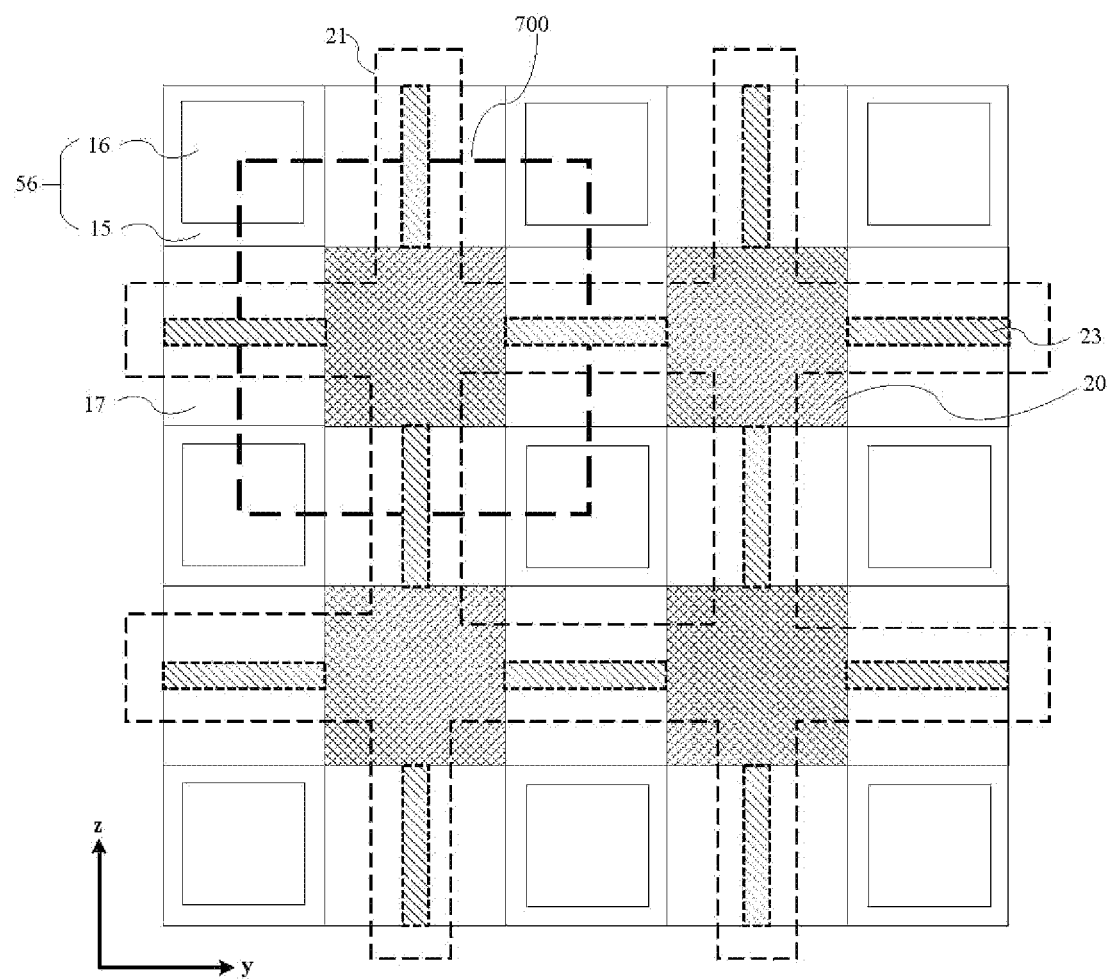
FIG. 26 shows a top view of a quadrilateral trench-gate power MOSFET with optimized layout with another embodiment of the present disclosure.
Figure 27:
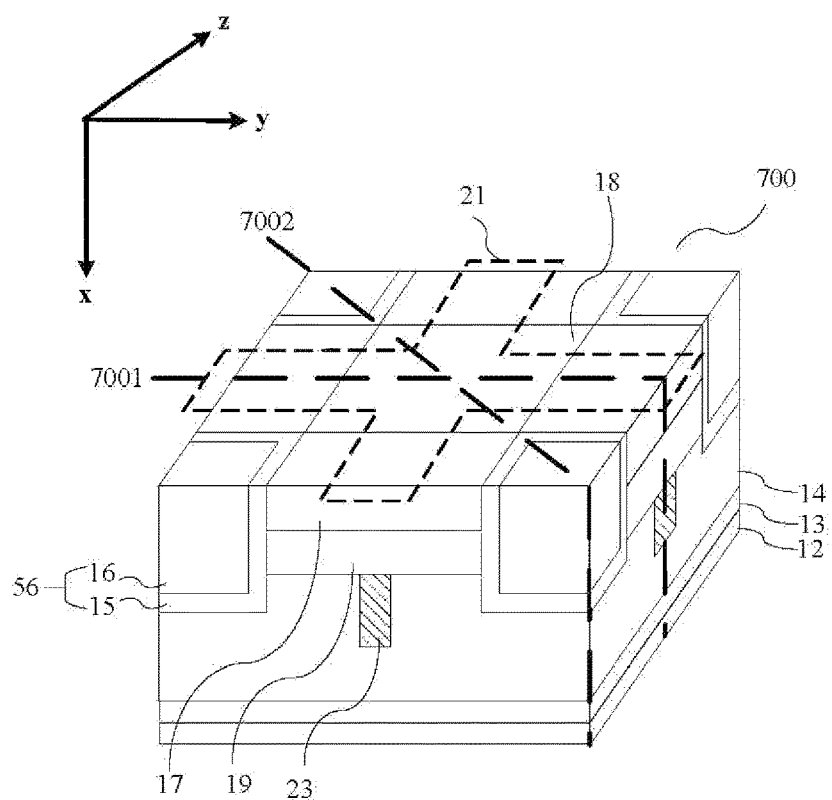
FIG. 27 schematically shows a cell 700 of a quadrilateral trench-gate power MOSFET in FIG. 26 with an embodiment of the present disclosure.
Figure 28:
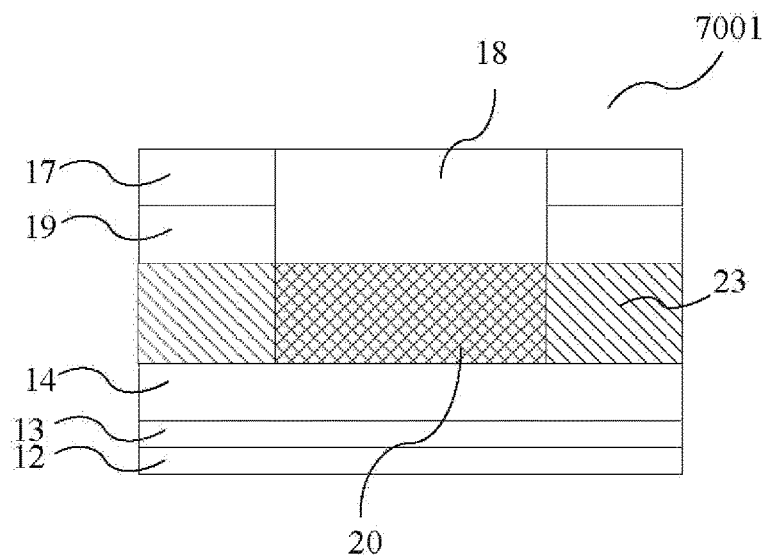
FIG. 28 schematically shows a cross-section view of the cell 700 of the quadrilateral trench-gate power MOSFET in region 7001 in FIG. 26 with an embodiment of the present disclosure.
Figure 29:
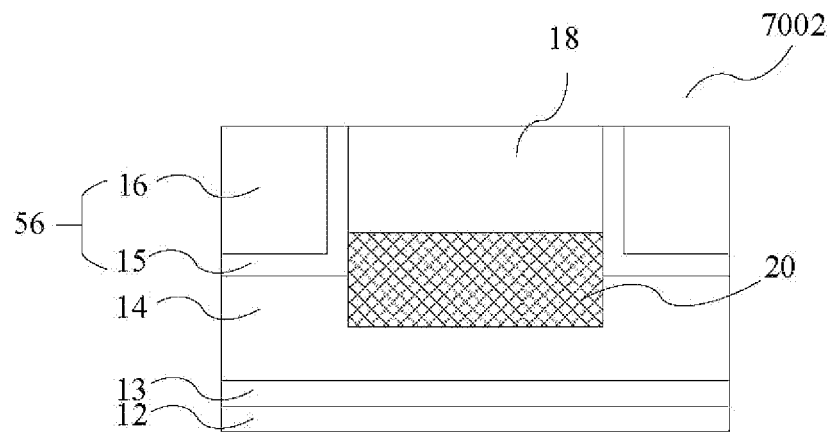
FIG. 29 shows a cross-section view of the cell 700 of the quadrilateral trench-gate power MOSFET in region 7002 in FIG. 26 with an embodiment of the present disclosure.

FIG. 26 shows a top view of a quadrilateral trench-gate power MOSFET with optimized layout with another embodiment of the present disclosure (to reflect the distribution in the top view of the first shielding region 20, the second shielding region 23, the projection is also shown in it). FIG. 27 schematically shows a cell 700 of the quadrilateral trench-gate power MOSFET in FIG. 26. FIG. 28 and FIG. 29 are the cross-section views of the cell 700 of the quadrilateral trench-gate power MOSFET in region 7001 and 7002. With embodiments shown in FIG. 26 to FIG. 29, the difference between the cell 700 of the quadrilateral trench-gate power MOSFET and the cell 100 of the quadrilateral trench-gate power MOSFET with embodiments shown in FIG. 2 to FIG. 6 is in that, the cell 700 further including the second shielding region 23 formed under the second semiconductor region 17, the second shielding region 23 is located between two adjacent trench isolation gate structures 56, connecting simultaneously to multiple the first shielding regions 20 (e.g., the second shielding region 23 is formed between every two adjacent the first shielding regions 20, all the first shielding regions 20 connect through the second shielding region), which has the third P-type doping concentration. With an embodiment of the present disclosure, the cross-section shape of the second shielding region 23 is a square or rectangle between two edges of two gate oxide layers 15 adjacent to it, and intersects with the first shielding region 20 but not intersects with two adjacent trench isolation gate structures 56. With an embodiment shown in FIG. 28, the first shielding region 20 is located between two second shielding regions 23.

Figure 30:
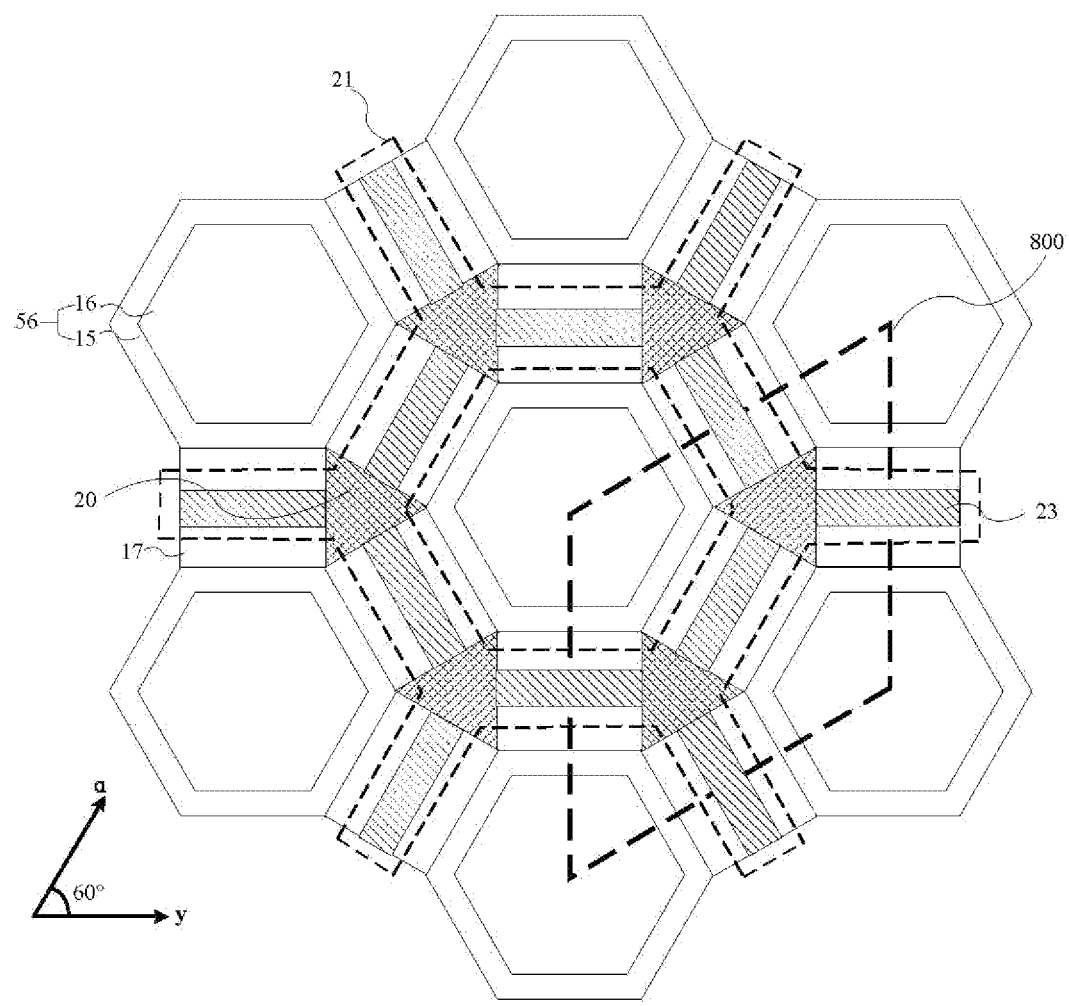
FIG. 30 shows a top view of a hexagonal trench-gate power MOSFET with another embodiment of the present disclosure.
Figure 31:
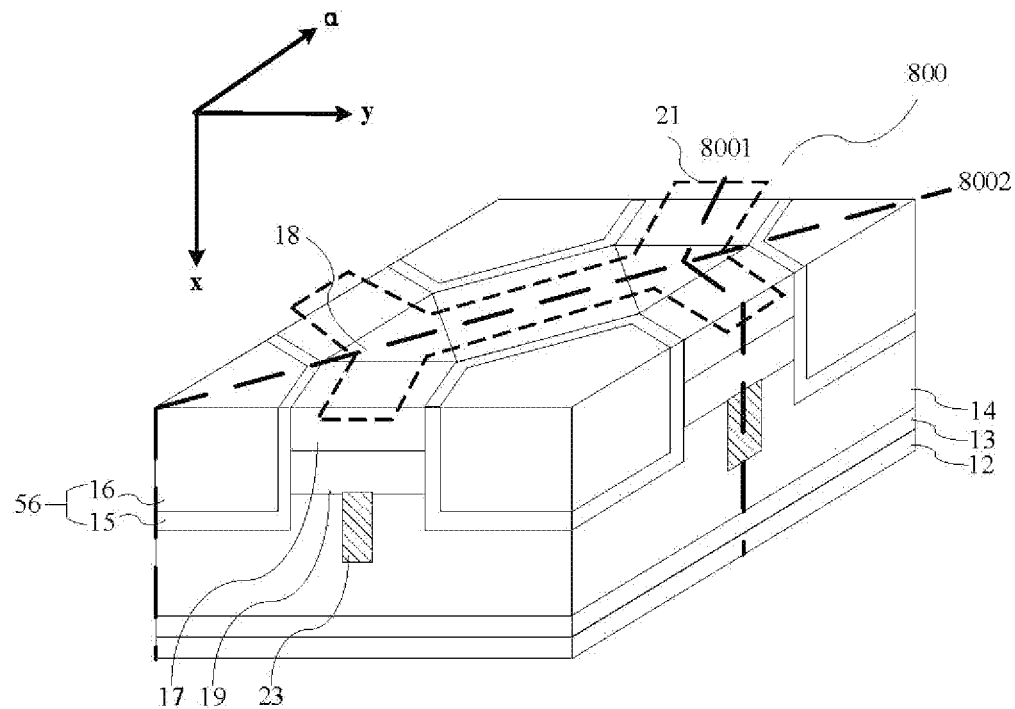
FIG. 31 schematically shows a cell 800 of a hexagonal trench-gate power MOSFET in FIG. 30 with an embodiment of the present disclosure.
Figure 32:
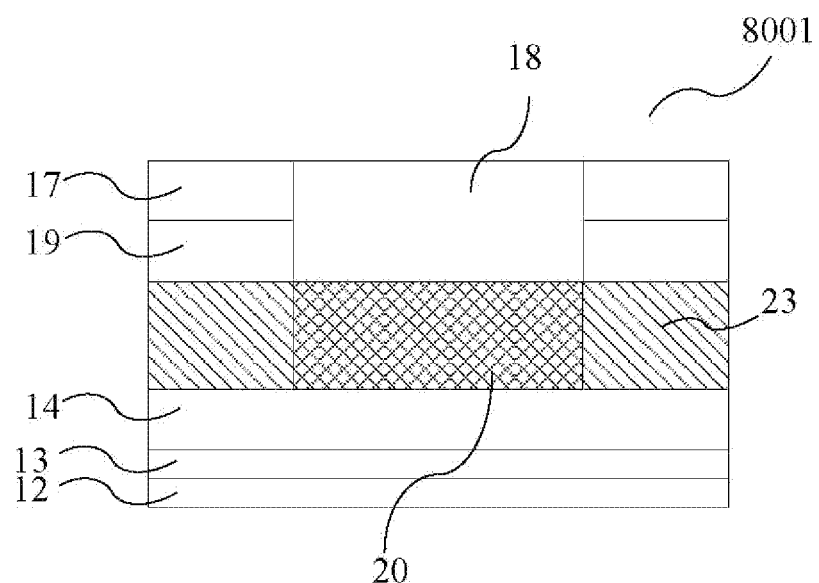
FIG. 32 shows a cross-section view of the cell 800 of the hexagonal trench-gate power MOSFET in region 8001 in FIG. 30 with an embodiment of the present disclosure.
Figure 33:
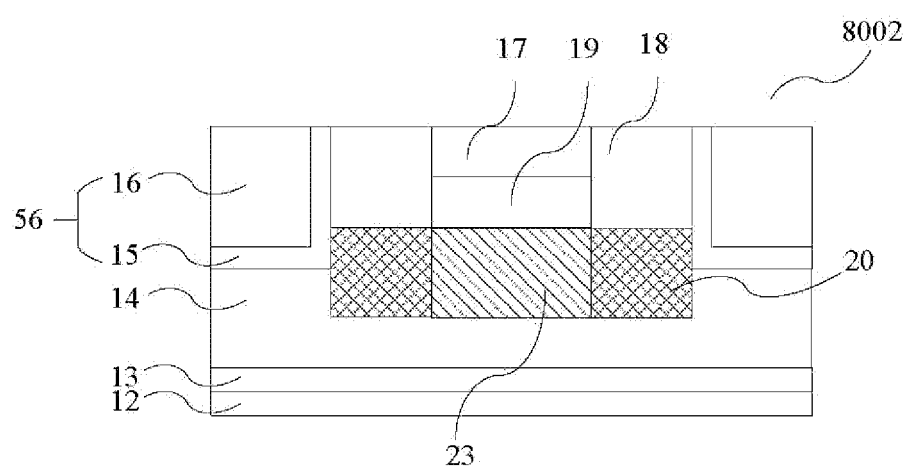
FIG. 33 shows a cross-section view of the cell 800 of the hexagonal trench-gate power MOSFET in region 8002 in FIG. 30 with an embodiment of the present disclosure.

FIG. 30 shows a top view of a hexagonal trench-gate power MOSFET with optimized layout with another embodiment of the present disclosure (to reflect the distribution in the top view of the first shielding region 20, the second shielding region 23, the projection is also shown in it). FIG. 31 schematically shows a cell 800 of the hexagonal trench-gate power MOSFET in FIG. 30. FIG. 32 and FIG. 33 are the cross-section views of the cell 800 of the hexagonal trench-gate power MOSFET in region 8001 and 8002. With embodiments shown in FIG. 30 to FIG. 33, the difference between the cell 800 of the hexagonal trench-gate power MOSFET and the cell 200 of the hexagonal trench-gate power MOSFET with embodiments shown in FIG. 6 to FIG. 9 is in that, the cell 800 further including the second shielding region 23 formed under the second semiconductor region 17, the second shielding region 23 is located between two adjacent trench isolation gate structures 56, connecting simultaneously with multiple the first shielding regions 20 (e.g., the second shielding region 23 is formed between every two adjacent the first shielding regions 20, all the first shielding regions 20 connect through the second shielding region), which has the third P-type doping concentration. With an embodiment of the present disclosure, the cross-section shape of the second shielding region 23 is a square or rectangle between two edges of two gate oxide layers 15 adjacent to it, and intersects with the first shielding region 20 but not intersects with two adjacent trench isolation gate structures 56. With embodiments shown in FIG. 32 and FIG. 33, the first shielding region 20 is located between two second shielding regions 23.

The embodiments shown in FIG. 26 to FIG. 33 compared with that in FIG. 2 to FIG. 9, further increase the total area of the shielding region, and all the trench positions are shielded effectively, which is good for reducing the electric field in the gate oxide layer corner, further improving the oxide reliability.

Figure 34:
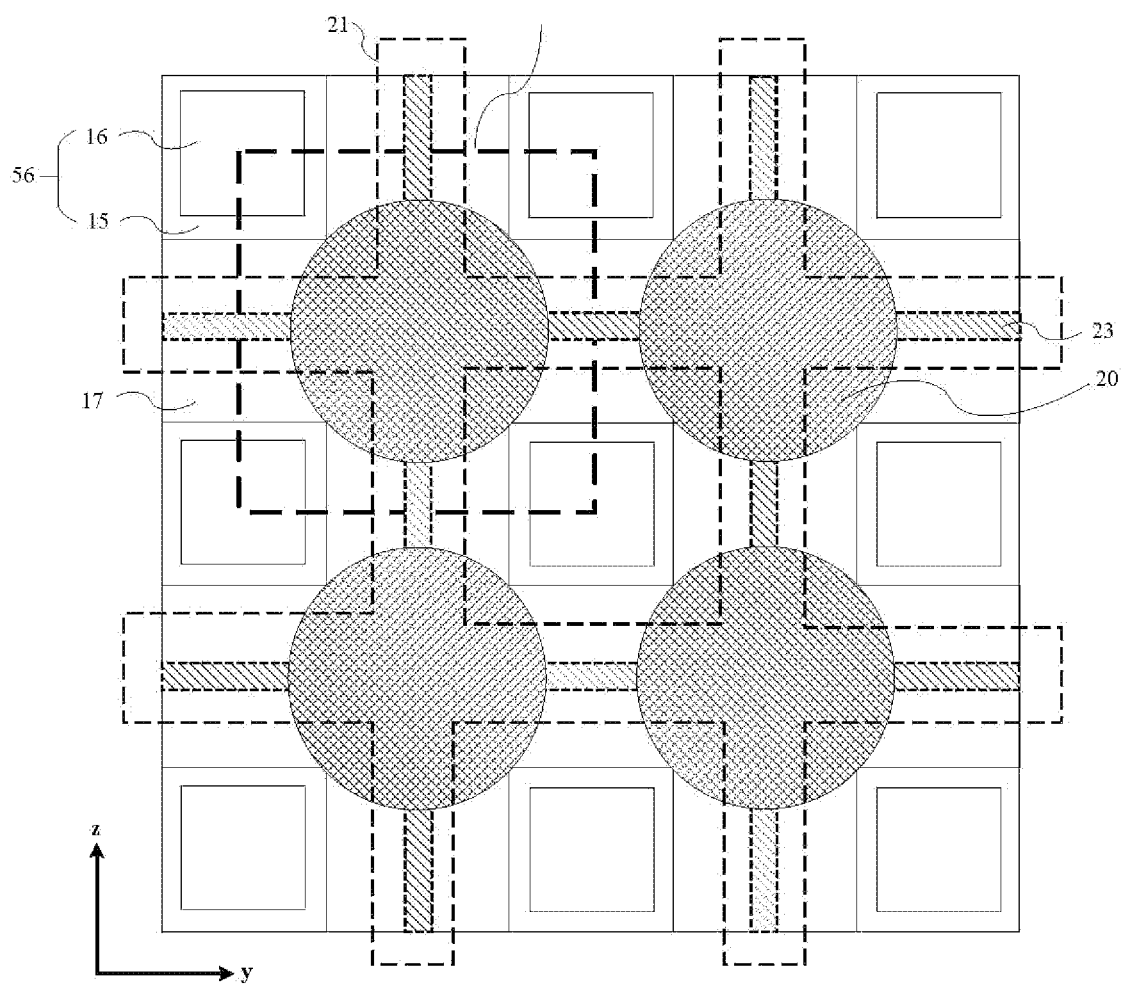
FIG. 34 shows a top view of a quadrilateral trench-gate power MOSFET with optimized layout with another embodiment of the present disclosure.
Figure 35:
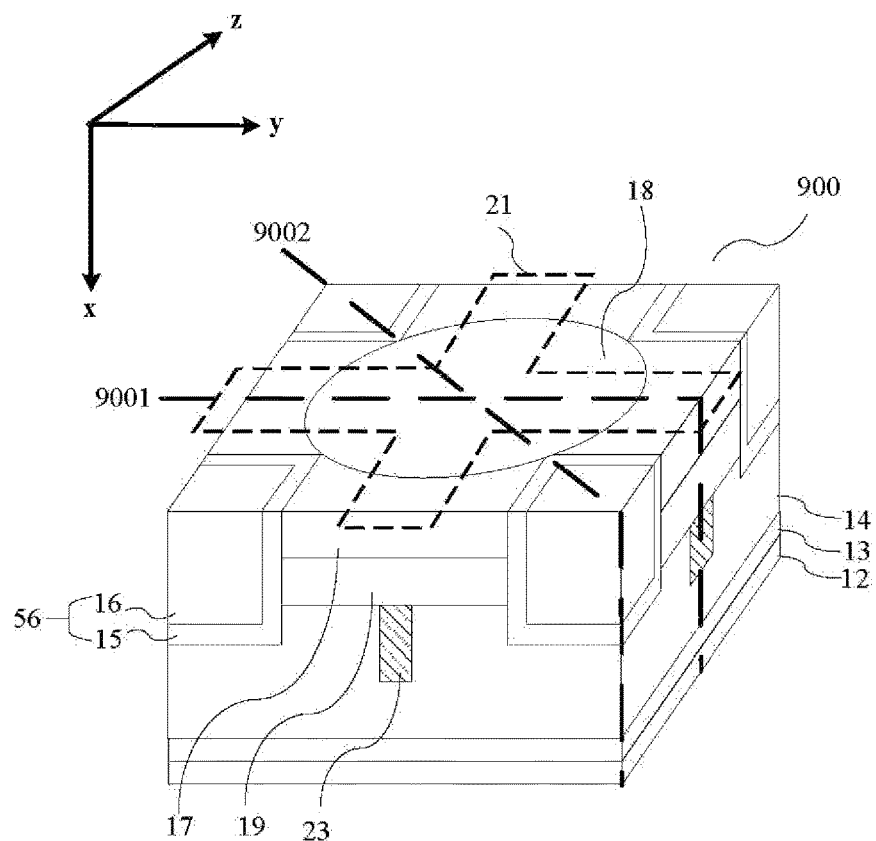
FIG. 35 schematically shows a cell 900 of the quadrilateral trench-gate power MOSFET in FIG. 34 structure with an embodiment of the present disclosure.
Figure 36:
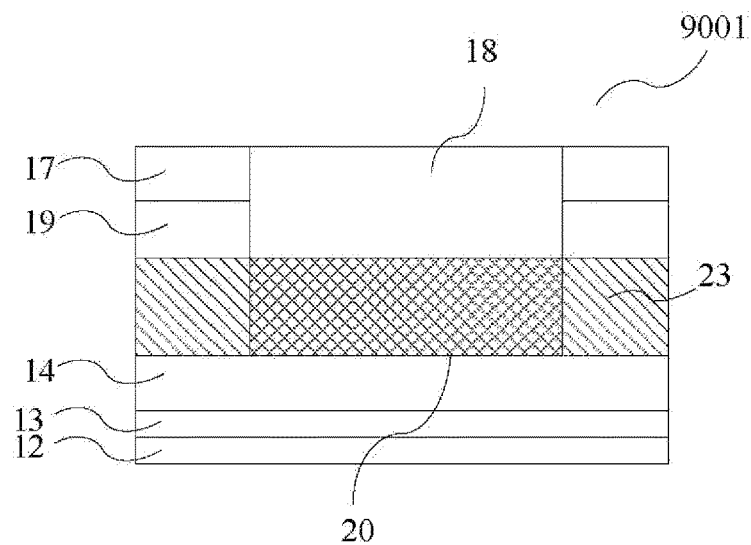
FIG. 36 shows a cross-section view of the cell 900 of the quadrilateral trench-gate power MOSFET in region 9001 in FIG. 34 with an embodiment of the present disclosure.
Figure 37:
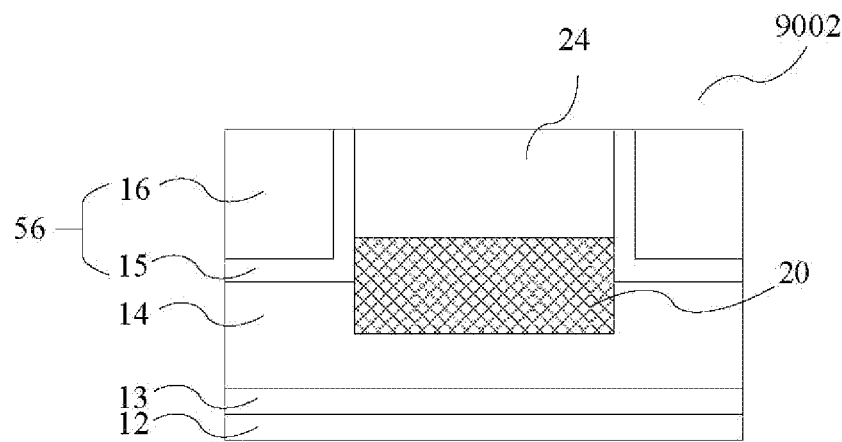
FIG. 37 shows a cross-section view of the cell 900 of the quadrilateral trench-gate power MOSFET in region 9002 in FIG. 34 with an embodiment of the present disclosure.

FIG. 34 shows a top view of a quadrilateral trench-gate power MOSFET with optimized layout with another embodiment of the present disclosure (to reflect the distribution in the top view of the first shielding region 20, the second shielding region 23, the projection is also shown in it). FIG. 35 schematically shows a cell 900 of the quadrilateral trench-gate power MOSFET in FIG. 34. FIG. 36 and FIG. 37 are the cross-section views of the cell 900 of the quadrilateral trench-gate power MOSFET in region 9001 and 9002, respectively. The difference between the cell 900 of the quadrilateral trench-gate power MOSFET with embodiments shown in FIG. 34 to FIG. 37 and the cell 500 of the quadrilateral trench-gate power MOSFET with embodiments shown in FIG. 18 to FIG. 21 is that, the cell 900 further including the second shielding region 23 formed under the second semiconductor region 17 and the fourth semiconductor region 19, the second shielding region 23 is located between two adjacent trench isolation gate structures 56, connecting simultaneously with multiple the first shielding regions 20 (e.g., the second shielding region 23 is formed between every two adjacent the first shielding regions 20, all the first shielding regions 20 connect through the second shielding region), which has the third P-type doping concentration. With an embodiment of the present disclosure, the cross-section shape of the second shielding region 23 is a square or rectangle between two edges of two gate oxide layers 15 adjacent to it, and intersects with the first shielding region 20 but not intersects with two adjacent trench isolation gate structures 56. With an embodiment shown in FIG. 36, the first shielding region 20 is located between two second shielding regions 23.

Figure 38:
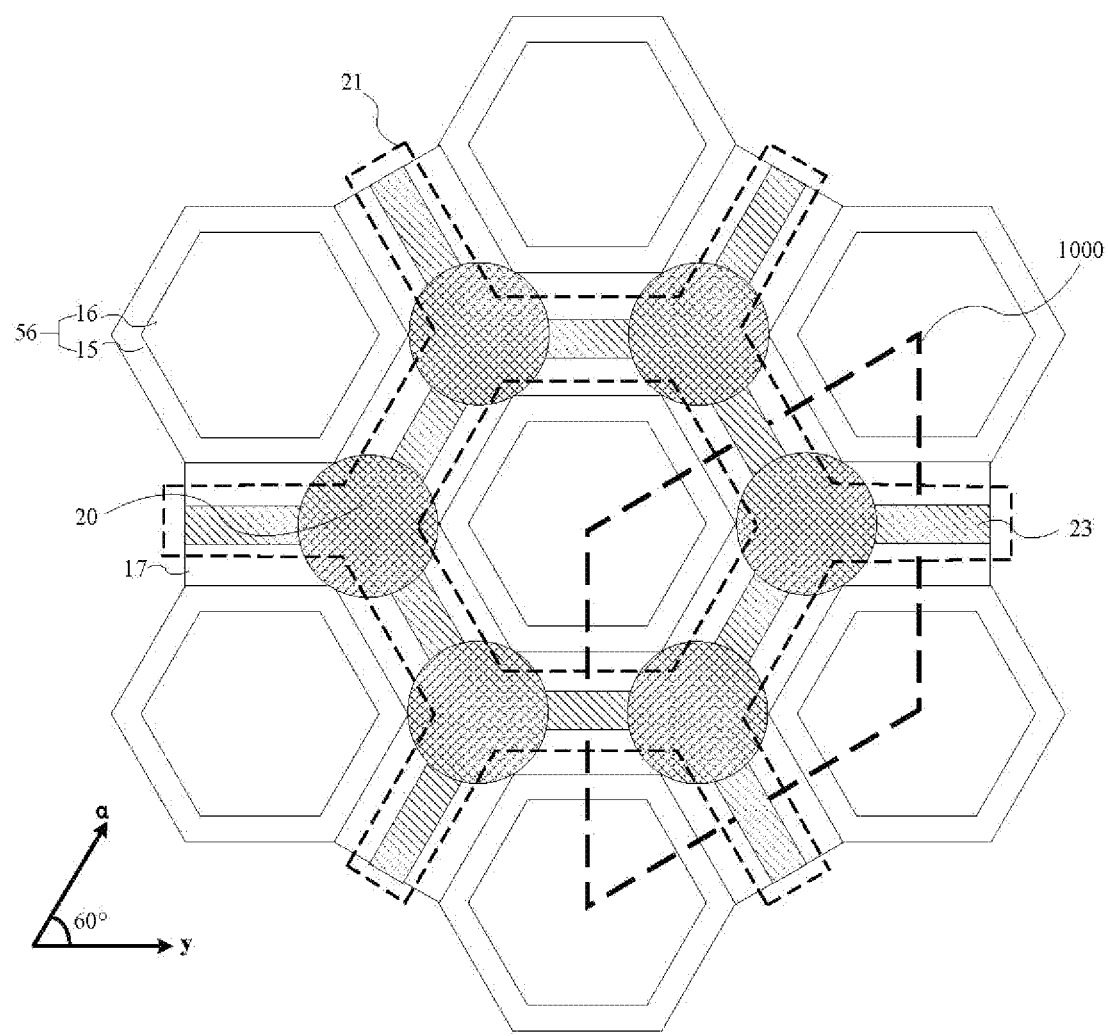
FIG. 38 shows a top view of a hexagonal trench-gate power MOSFET with optimized layout with another embodiment of the present disclosure.
Figure 39:
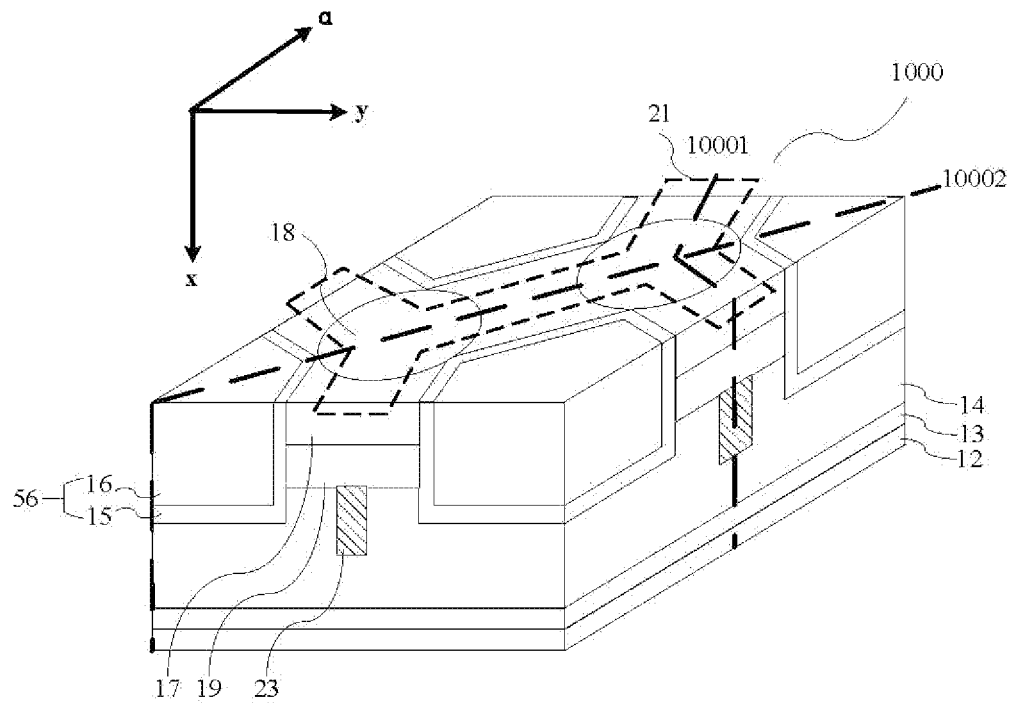
FIG. 39 schematically shows a cell 1000 of the hexagonal trench-gate power MOSFET in FIG. 38 with an embodiment of the present disclosure.
Figure 40:
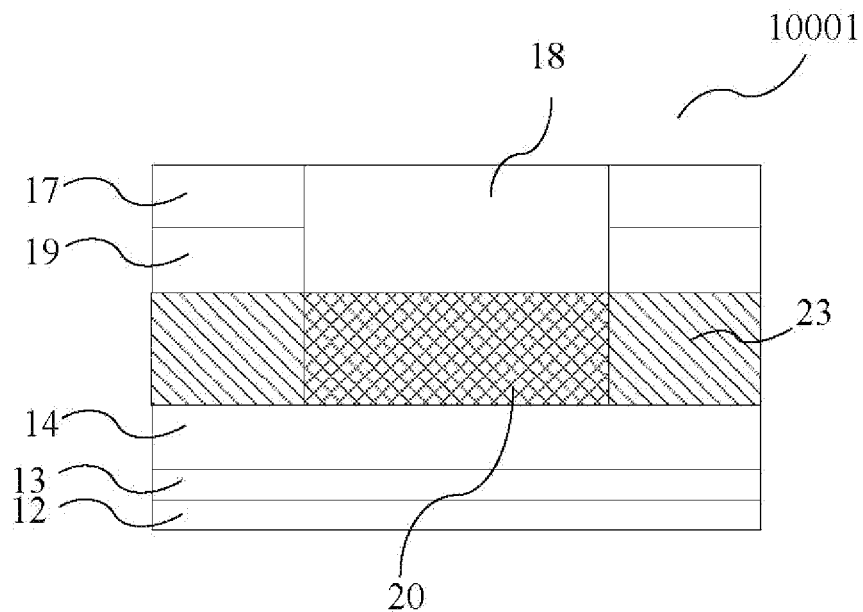
FIG. 40 shows a cross-section view of the cell 1000 of the hexagonal trench-gate power MOSFET in region 10001 in FIG. 38 with an embodiment of the present disclosure.
Figure 41:
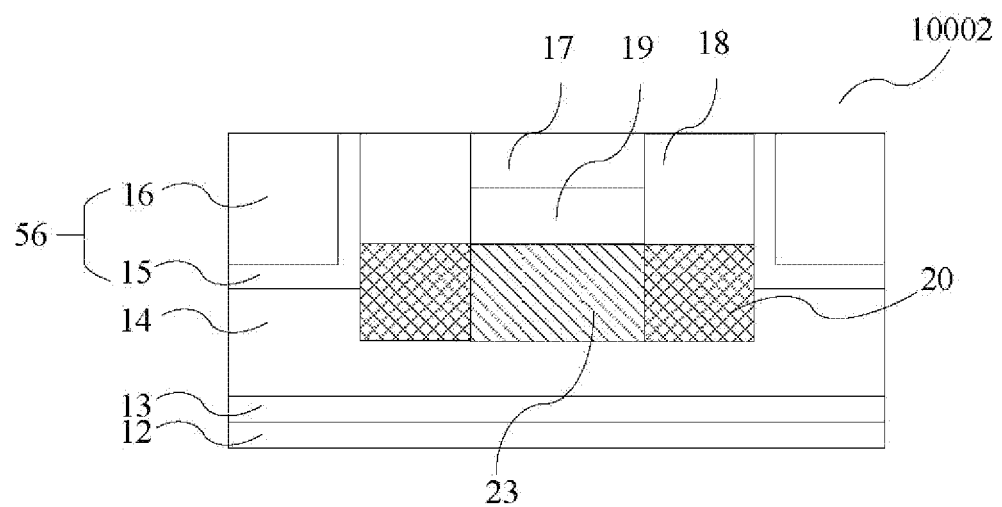
FIG. 41 shows a cross-section view of the cell 1000 of the hexagonal trench-gate power MOSFET in region 10002 in FIG. 38 with an embodiment of the present disclosure.

FIG. 38 shows a top view of a hexagonal trench-gate power MOSFET with optimized layout with another embodiment of the present disclosure (to reflect the distribution in the top view of the first shielding region 20, the second shielding region 23, the projection is also shown in it). FIG. 39 schematically shows a cell 1000 of the hexagonal trench-gate power MOSFET in FIG. 38. FIG. 40 and FIG. 41 are the cross-section views of the cell 1000 of the hexagonal trench-gate power MOSFET in region 10001 and 10002. With embodiments shown in FIG. 38 to FIG. 41, the difference between the cell 1000 of the hexagonal trench-gate power MOSFET and the cell 600 of the hexagonal trench-gate power MOSFET with embodiments shown in FIG. 22 to FIG. 25 is that, the cell 1000 further including the second shielding region 23 formed under the second semiconductor region 17, the second shielding region 23 is located between two adjacent trench isolation gate structures 56, connecting simultaneously to multiple the first shielding regions 20 (e.g., the second shielding region 23 is formed between every two adjacent the first shielding regions 20, all the first shielding regions 20 connect through the second shielding region), which has the third P-type doping concentration. With an embodiment of the present disclosure, the cross-section shape of the second shielding region 23 is a square or rectangle between two edges of two gate oxide layers 15 adjacent to it, and intersects with the first shielding region 20 but not intersects with two adjacent trench isolation gate structures 56. With an embodiment shown in FIG. 40 and FIG. 41, the first shielding region 20 is located between two second shielding regions 23.

The embodiments shown in FIG. 34 to FIG. 41 combine the advantages of embodiments shown in FIG. 18 to FIG. 25 and embodiments shown in FIG. 26 to FIG. 33, compared to the embodiments shown in FIGS. 2 to 9, further increasing the total area of shielding region, which is good for reducing the electric field in the gate oxide layer corner, further improving the oxide reliability.

A person skilled in the art should know that any combination or assembly of the structures in FIG. 2 to FIG. 41 should be comprehended as a technical solution or an embodiment proposed by this disclosure. E.g., the first shielding region and second shielding region could be formed simultaneously or independently in the device. The first shielding region or the second shielding region referred to in the present disclosure could be considered to be all the cells of the whole device including the first shielding region or the second shielding region, which could also be considered to be the first shielding region and second shielding region in a part of the cell.

Obviously, many modifications and variations of the present disclosure are possible in light of the above teachings. It is therefore to be understood that within the scope of the appended claims the disclosure may be practiced otherwise than as specifically described. It should be understood, of course, the foregoing disclosure relates only to a preferred embodiment (or embodiments) of the disclosure and that numerous modifications may be made therein without departing from the spirit and the scope of the disclosure as set forth in the appended claims. Various modifications are contemplated and they obviously will be resorted to by those skilled in the art without departing from the spirit and the scope of the disclosure as hereinafter defined by the appended claims as only a preferred embodiment(s) thereof has been disclosed.

What is claimed is:

1. A trench-gate power MOSFET with optimized layout, comprising:
   a substrate;
   a first semiconductor region with a first doping type formed on the substrate;
   trench isolation gate structures formed on the first semiconductor region, wherein the trench isolation gate structures are mutually separated, each of the trench isolation gate structures comprises a gate oxide layer and a gate electrode;
   a second semiconductor region and a third semiconductor region formed between any two adjacent structures of the trench isolation gate structures, wherein the second semiconductor region is with the first doping type, the third semiconductor region is with a second doping type; and
   a first shielding region formed under the third semiconductor region, is configured to contact the trench isolation gate structures and electrically connect the third semiconductor region, wherein the first shielding region is formed below the third semiconductor region and adjacent to the third semiconductor region,
   wherein, a top view of the third semiconductor region and a top view of the first shielding region are identical everywhere.

2. The trench-gate power MOSFET according to claim 1, wherein the first shielding region is defined by a shortest linear connection between adjacent vertices of a plurality of trench isolation gate structures, or the first shielding region is defined by a smallest circle of adjacent vertices of the plurality of trench isolation gate structures, wherein the plurality of the trench isolation gate structures are configured to connect to the first shielding region.

3. The trench-gate power MOSFET according to claim 2, wherein the trench isolation gate structures are in a quadrilateral design on a surface of the trench-gate power MOSFET, a cross-section shape of the first shielding region is in a quadrilateral design from the top view formed by connection of vertices of four gate oxide layers, or the cross-section shape of the first shielding region is a smallest circle defined by the vertices of the four gate oxide layers.

4. The trench-gate power MOSFET according to claim 3, further comprising a second shielding region formed between at least two adjacent trench isolation gate structures.

5. The trench-gate power MOSFET according to claim 2, wherein the trench isolation gate structures are in a hexagonal design on the surface of the trench-gate power MOSFET, a cross-section shape of the first shielding region is in a triangle design from a top view formed by connection of vertices of three gate oxide layers or, the cross-section shape of the first shielding region is a smallest circle defined by the vertices of the three gate oxide layers.

6. The trench-gate power MOSFET according to claim 5, further comprising a second shielding region formed between at least two adjacent trench isolation gate structures.

7. The trench-gate power MOSFET according to claim 2, further comprising a second shielding region formed between at least two adjacent trench isolation gate structures.

8. The trench-gate power MOSFET according to claim 1, further comprising a second shielding region formed between at least two adjacent trench isolation gate structures.

9. The trench-gate power MOSFET according to claim 8, wherein the second shielding region is intersected with an adjacent edge of the at least two adjacent trench gate isolation structures, and not intersected with the first shielding region.

10. The trench-gate power MOSFET according to claim 8, wherein the second shielding region is intersected with the first shielding region, and not intersected with the at least two adjacent trench isolation gate structures.

11. The trench-gate power MOSFET according to claim 10, wherein the second shielding region is formed between each two adjacent trench isolation structures, the second shielding region connects all the first shielding regions together.

12. The trench-gate power MOSFET according to claim 1, further comprising a second shielding region formed between at least two adjacent trench isolation gate structures.

13. A trench-gate power MOSFET with optimized layout, comprising a substrate and a first semiconductor region with a first doping type formed on the substrate; mutually separated trench isolation gate structures formed on the first semiconductor region, and at least one first shielding region with a second doping type, connecting simultaneously to multiple mutually separated trench isolation gate structures, a shape of the at least one first shielding region and a position of the at least one first shielding region are defined by adjacent vertices of multiple trench isolation gate structures connecting to the at least one first shielding region, wherein the first shielding region is formed below the third semiconductor region and adjacent to the third semiconductor region.

14. The trench-gate power MOSFET according to claim 13, the shape of the at least one first shielding region and the position of the at least one first shielding region are defined by the adjacent vertices of the multiple trench isolation gate structures connecting to the at least one first shielding region, comprising: the shape of the at least one first shielding region and the position of the at least one first shielding region are defined by the shortest linear connection of adjacent vertices of a plurality of trench isolation gate structures, or the shape of the at least one first shielding region and the position of the at least one first shielding region are defined by a smallest circle of adjacent vertices of the plurality of trench isolation gate structures, wherein the plurality of the trench isolation gate structures are configured to connect to the first shielding region.

15. The trench-gate power MOSFET according to claim 14, wherein the trench isolation gate structures are in a quadrilateral design on a surface of the trench-gate power MOSFET, a cross-section shape of the first shielding region is in a quadrilateral design from the top view formed by connection of vertices of four gate oxide layers, or the cross-section shape of the first shielding region is a smallest circle defined by the vertices of the four gate oxide layers.

16. The trench-gate power MOSFET according to claim 14, wherein the trench isolation gate structures are in a hexagonal design on the surface of the trench-gate power MOSFET, a cross-section shape of the first shielding region is in a triangle design from a top view formed by connection of vertices of three gate oxide layers or, the cross-section shape of the first shielding region is a smallest circle defined by the vertices of the three gate oxide layers.

17. The trench-gate power MOSFET according to claim 13, further comprising at least one second shielding region, each of the at least one second shielding region intersecting simultaneously with two or more than two trench isolation gate structures at sidewalls of trench isolation gate structures, or connecting simultaneously with multiple the first shielding regions.

18. The trench-gate power MOSFET according to claim 17, wherein on a top cross-section view, the second shielding region is formed between at least two adjacent trench isolation gate structures, and intersects with adjacent edges of the at least two adjacent trench isolation gate structures, and not intersects with the first shielding region.

19. The trench-gate power MOSFET according to claim 17, wherein the second shielding region is formed between at least two adjacent trench isolation gate structures, and intersects with the first shielding region, and not intersects with the at least two adjacent trench isolation gate structures.

\* \* \* \* \*